(12) United States Patent
Hong et al.

(10) Patent No.: US 12,490,573 B2
(45) Date of Patent: Dec. 2, 2025

(54) CONDUCTIVE SUBSTRATE, PEROVSKITE SUBSTRATE USING THE CONDUCTIVE SUBSTRATE AND SOLAR CELL USING THE PEROVSKITE SUBSTRATE

(71) Applicant: KOREA INSTITUTE OF ENERGY RESEARCH, Daejeon (KR)

(72) Inventors: Sung-jun Hong, Daejeon (KR); Chi-hwan Han, Daejeon (KR); Se-jin Ahn, Daejeon (KR); Inyoung Jeong, Cheongju-si (KR); Asmat Ullah, Daejeon (KR)

(73) Assignee: Korea Institute of Energy Research, Daejeon (KR)

( * ) Notice: Subject to any disclaimer, the term of this patent is extended or adjusted under 35 U.S.C. 154(b) by 98 days.

(21) Appl. No.: 18/548,648

(22) PCT Filed: Oct. 29, 2021

(86) PCT No.: PCT/KR2021/015384
§ 371 (c)(1),
(2) Date: Sep. 1, 2023

(87) PCT Pub. No.: WO2022/186439
PCT Pub. Date: Sep. 9, 2022

(65) Prior Publication Data
US 2024/0188428 A1    Jun. 6, 2024

(30) Foreign Application Priority Data
Mar. 2, 2021  (KR) .......................... 10-2021-0027146

(51) Int. Cl.
*H10K 30/50*    (2023.01)
*C07F 9/6547*    (2006.01)
(Continued)

(52) U.S. Cl.
CPC ........... *H10K 30/50* (2023.02); *C07F 9/6547* (2013.01); *H10K 30/40* (2023.02); *H10K 85/50* (2023.02); *H10K 85/657* (2023.02); *H10K 30/86* (2023.02)

(58) Field of Classification Search
CPC ........ H10K 30/50; H10K 30/40; H10K 30/86; H10K 85/657; H10K 85/50; C07F 9/6547
See application file for complete search history.

(56) References Cited

FOREIGN PATENT DOCUMENTS

| JP | 2008-543025 A | 11/2008 |
|---|---|---|
| KR | 10-2013-0009141 A | 1/2013 |

(Continued)

OTHER PUBLICATIONS

Al-Ashouri (Year: 2019).*
(Continued)

*Primary Examiner* — Sadie White
(74) *Attorney, Agent, or Firm* — Rabin & Berdo, P.C.

(57) ABSTRACT

The present invention discloses a conductive substrate, a perovskite substrate using the conductive substrate, and a solar cell using the perovskite substrate. The conductive substrate, the perovskite substrate, and the solar cell of the present invention include a conductive base and a conductive compound stacked on the conductive base. The conductive compound is represented by Formula 1, 2 or 3. The conductive compound is capable of multi-electron redox reactions, possesses p-type organic molecular properties, and has an oxidation potential or highest occupied molecular orbital (HOMO) matching the valence band of perovskite so that holes generated in an absorber layer are selectively separated for the application of the perovskite material, achieving enhanced photoelectric conversion efficiency of (Continued)

the solar cell and a significantly reduced difference between the forward and reverse conversion efficiencies (hysteresis index) of the solar cell.

5 Claims, 16 Drawing Sheets

(51) Int. Cl.
*H10K 30/40* (2023.01)
*H10K 30/86* (2023.01)
*H10K 85/50* (2023.01)
*H10K 85/60* (2023.01)

(56) References Cited

FOREIGN PATENT DOCUMENTS

| KR | 10-1462025 B1 | 11/2014 |
|---|---|---|
| KR | 10-1561283 B1 | 10/2015 |

OTHER PUBLICATIONS

Al-Ashouri (Year: 2020).*
Hart (Year: 2012).*
Magomedov (Year: 2018).*
Wang (Year: 2007).*
Grisorio, R. et al., "Molecular Tailoring of Phenothiazine-Based Hole-Transporting Materials for High-Performing Perovskite Solar Cells", ACS Energy Letters, vol. 2, pp. 1029-1034, Apr. 10, 2017.
Revoju, S. et al., "Structure-induced optoelectronic properties of phenothiazine-based materials", Journal of Materials Chemistry C, vol. 8, pp. 15486-15506, Oct. 15, 2020.
Salunke, J. et al., "Phenothiazine-Based Hole-Transporting Materials toward Eco-friendly Perovskite Solar Cells", ACS Applied Energy Materials, vol. 2, pp. 3021-3027, Apr. 8, 2019.

* cited by examiner

CONDUCTIVE SUBSTRATE, PEROVSKITE SUBSTRATE USING THE CONDUCTIVE SUBSTRATE AND SOLAR CELL USING THE PEROVSKITE SUBSTRATE

TECHNICAL FIELD

The present invention relates to a conductive substrate, a perovskite substrate using the conductive substrate, and a solar cell using the perovskite substrate. More specifically, the present invention relates to a uniform conductive substrate using a specific conductive compound that is capable of multi-electron redox reactions, possesses p-type organic molecular properties, and has an oxidation potential or highest occupied molecular orbital (HOMO) matching the valence band of perovskite so that holes generated in an absorber layer are selectively separated for the application of the perovskite material, achieving enhanced photoelectric conversion efficiency of a solar cell and a significantly reduced difference between the forward and reverse conversion efficiencies (hysteresis index) of a solar cell, a perovskite substrate using the conductive substrate, and a solar cell using the perovskite substrate.

BACKGROUND ART

With the depletion of fossil fuels, considerable research has concentrated on inexhaustible and clean alternative energy sources. Particularly, there has been much interest in solar cells that can directly convert sunlight into electrical energy. n-p diode type silicon (Si) single crystal-based solar cells with a solar energy conversion efficiency of more than 20% can be fabricated at present and are widely used for practical photovoltaic applications.

However, the fabrication of such inorganic semiconductor-based solar cells requires the consumption of a lot of energy to purify raw materials and involves a high cost to form single crystals or thin films using raw materials, making it difficult to utilize the solar cells on a large scale.

As alternatives to solve these problems, dye-sensitized solar cells and organic solar cells have been actively studied that can be fabricated using low cost materials and processes. The highest efficiencies of liquid dye-sensitized solar cells reported to date have remained at only 11-12% for the last two decades. Although liquid dye-sensitized solar cells have potential for commercialization due to their relatively high efficiency, the use of volatile liquid electrolytes causes stability problems with time and the use of expensive ruthenium (Ru)-based dyes is also problematic in the fabrication of liquid dye-sensitized solar cells at low cost.

In attempts to solve these problems, studies have been conducted on dye-sensitized solar cells that use a non-volatile electrolyte using an ionic solvent instead of a volatile liquid electrolyte, a polymeric gel electrolyte, and an inexpensive pure organic dye. However, these dye-sensitized solar cells have the problem of low efficiency compared to dye-sensitized solar cells using a volatile liquid electrolyte and a ruthenium-based dye.

Organic photovoltaic cells (OPVs) have begun to be studied in earnest since the mid-1990s. Organic photovoltaic cells are composed of an organic material with electron donor (D) properties (sometimes called hole acceptor properties) and an organic material with electron acceptor (A) properties.

A solar cell composed of organic molecules absorbs light to generate electrons and holes, which recombine to form excitons. The excitons migrate to the donor (D)-acceptor (A) interface, where they dissociate into charges. The electrons and holes migrate to electron acceptors and electron donors, respectively, to generate a photocurrent.

Since organic solar cells have the advantages that the organic materials are easy to process, diverse, and inexpensive. Due to these advantages, organic solar cells can be fabricated using a simple process at low cost compared to existing solar cells.

However, organic solar cells rapidly lose their efficiency, that is, they have serious stability problems, because their BHJ architecture tends to be degraded by moisture or oxygen in the air.

As a solution to these problems, full sealing technology was introduced to increase the stability of organic solar cells. However, this technology increases the price of organic solar cells.

Research has been reported on solar cells that use quantum dot nanoparticles instead of a dye in an absorber layer and a hole conducting inorganic or organic material instead of a liquid electrolyte. A number of solar cells have also been reported that use CdSe or PbS quantum dots and a conducting polymer such as spiro-OMeTAD or P3HT as a hole conducting organic material. However, the efficiencies of the reported solar cells are still as low as less than 5%.

A technology is currently being developed where a material having an organic-inorganic hybrid perovskite structure rather than quantum dots composed of a pure inorganic material is used instead of a dye in dye-sensitized solar cells. Particularly, recent organic-inorganic hybrid perovskite semiconductors whose basic chemical composition is represented by $ABX_3$ are easy to synthesize with various types of materials and can be used to fabricate solar cells at a low material cost. Due to these advantages, the recent organic-inorganic hybrid perovskite semiconductors have received a lot of attention as ultimate materials for next-generation solar cells.

Since perovskite solar cells can be fabricated by solution processing, like organic solar cells, they are applicable to a wide variety of large-area flexible devices. Thus, research has been conducted aimed at the utilization of perovskite solar cells in various fields such as lasers and light-emitting electronic devices. There is also a need for research on processing time and cost savings for the application and commercialization of perovskite solar cells in various fields.

The following prior art documents are cited: for example, Korean Patent No. 10-1462025 (Nov. 10, 2014) and Korean Patent No. 10-1561283 (Oct. 12, 2015).

DETAILED DESCRIPTION OF THE INVENTION

Problems to be Solved by the Invention

The present invention has been made in an effort to solve the above-described problems and is intended to provide a uniform conductive substrate using a specific conductive compound that is capable of multi-electron redox reactions, possesses p-type organic molecular properties, has an oxidation potential or highest occupied molecular orbital (HOMO) matching the valence band of perovskite, forms a self-assembled monolayer on a conductive base, and lowers the work function of the conductive base in a constant orientation of its electric dipole moment so that holes generated in an absorber layer are selectively separated for the application of the perovskite material, achieving enhanced photoelectric conversion efficiency of a solar cell and a significantly reduced difference between the forward and reverse conversion efficiencies (hysteresis index) of a solar cell. The present invention is also intended to provide a perovskite substrate using the conductive substrate and a solar cell using the perovskite substrate.

Means for Solving the Problems

One aspect of the present invention provides a conductive substrate including a conductive base and a conductive compound stacked on the conductive base, the conductive compound being represented by Formula 1, 2 or 3:

<Formula 1>

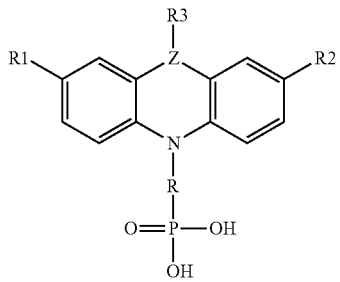

wherein Z is S, O or N, R is CH2$_n$ (n=1-10),

(n=1-4), R1 and R2 are each independently H, F, Cl, Br, I, CN, NO$_2$, alkyl chain, OCH$_3$, NH$_2$, N(alkyl)$_2$, N(aromatic)$_2$, OCHCH2CH2$_n$ (n=1-10),

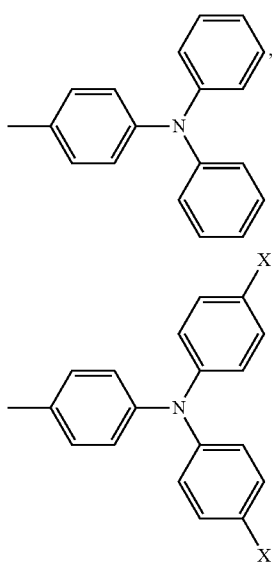

(X=H, F, Cl, Br, I, CN, NO$_2$, alkyl chain, OCH$_3$, NH$_2$ or N(alkyl)$_2$), and R3 is CH2$_n$ (n=1-10), OCH2CH2$_n$ (n=1-10),

(Y=F, Cl, Br, I, CN, NO$_2$, alkyl chain, OCH$_3$, NH$_2$, N(alkyl)$_2$ or

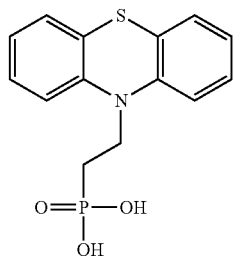

(n=1-4),

<Formula 2>

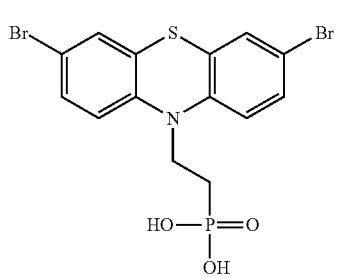

<Formula 3>

According to a further embodiment of the present invention, the conductive substrate may further include a current carrying layer deposited between the conductive base and the conductive compound.

According to another embodiment of the present invention, the conductive compound may form a self-assembled monolayer (SAM).

According to another embodiment of the present invention, the conductive compound may be a hole transport material.

According to another embodiment of the present invention, the conductive compound may have a dipole moment of 0.1 to 6.

The present invention also provides a perovskite substrate including the conductive substrate and a perovskite layer stacked on the conductive substrate.

The present invention also provides a solar cell including the perovskite substrate.

The present invention also provides a method for preparing the conductive substrate including the conductive compound represented by Formula 2 stacked on the conductive base, the method including sequentially synthesizing 10-(2-bromoethyl)-10H-phenothiazine, 3,7-dibromo-10-(2-bromoethyl)-10H-phenothiazine, diethyl(2-(3,7-dibromo-10H-phenothiazin-10-yl)ethyl)phosphonate, and (2-(3,7-dibromo-10H-phenothiazin-10-yl)ethyl)phosphonic acid.

According to another embodiment of the present invention, the 10-(2-bromoethyl)-10H-phenothiazine may be synthesized by reacting phenothiazine with 1,2-chloroethanol and brominating the terminal hydroxyl group of the reaction product.

The present invention also provides a method for preparing the conductive substrate including the conductive compound represented by Formula 3 stacked on the conductive base, the method including sequentially synthesizing 10-(2-bromoethyl)-10H-phenothiazine, 3,7-dibromo-10-(2-bromoethyl)-10H-phenothiazine, diethyl(2-(3,7-dibromo-10H-phenothiazin-10-yl)ethyl)phosphonate, and (2-(3,7-dibromo-10H-phenothiazin-10-yl)ethyl)phosphonic acid.

According to another embodiment of the present invention, the 10-(2-bromoethyl)-10H-phenothiazine may be synthesized by reacting phenothiazine with 1,2-chloroethanol and brominating the terminal hydroxyl group of the reaction product.

Effects of the Invention

The conductive substrate, the perovskite substrate, and the solar cell of the present invention uses a specific conductive compound that is capable of multi-electron redox reactions, possesses p-type organic molecular properties, has an oxidation potential or highest occupied molecular orbital (HOMO) matching the valence band of perovskite, forms a self-assembled monolayer on a conductive base, and lowers the work function of the conductive base in a constant orientation of its electric dipole moment so that holes generated in an absorber layer are selectively separated for the application of the perovskite material, achieving enhanced photoelectric conversion efficiency of a solar cell and a significantly reduced difference between the forward and reverse conversion efficiencies (hysteresis index) of a solar cell.

BEST MODE FOR CARRYING OUT THE INVENTION

The present invention will now be described in detail.

Technical terms used in this specification are used to merely illustrate specific embodiments, and should be understood that they are not intended to limit the present invention. As far as not being defined differently, technical terms used herein may have the same meaning as those generally understood by an ordinary person skilled in the art to which the present invention belongs, and should not be construed in an excessively comprehensive meaning or an excessively restricted meaning.

In addition, if a technical term used in the description of the present invention is an erroneous term that fails to clearly express the idea of the present invention, it should be replaced by a technical term that can be properly understood by the skilled person in the art. In addition, general terms used in the description of the present invention should be construed according to definitions in dictionaries or according to its front or rear context.

As used herein, the singular forms "a," "an" and "the" are intended to include the plural forms as well, unless the context clearly indicates otherwise. The terms "comprises", "comprising", "includes" and/or "including" as used herein should not be construed to necessarily include all of the elements or steps disclosed herein, and should be construed not to include some of the elements or steps thereof, or should be construed to further include additional elements or steps. In the description of the present invention, detailed explanations of related art are omitted when it is deemed that they may unnecessarily obscure the essence of the invention.

Figure 1:
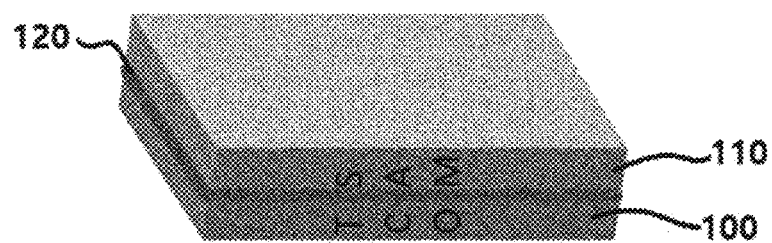
FIG. 1 is a perspective view of a conductive substrate according to the present invention.
Figure 2:
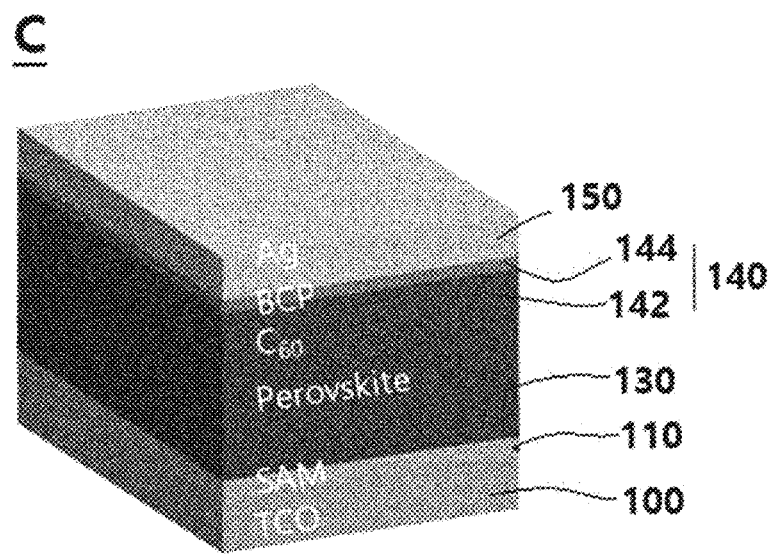
FIG. 2 is a perspective view of a solar cell using a perovskite substrate of the present invention.
Figure 3:
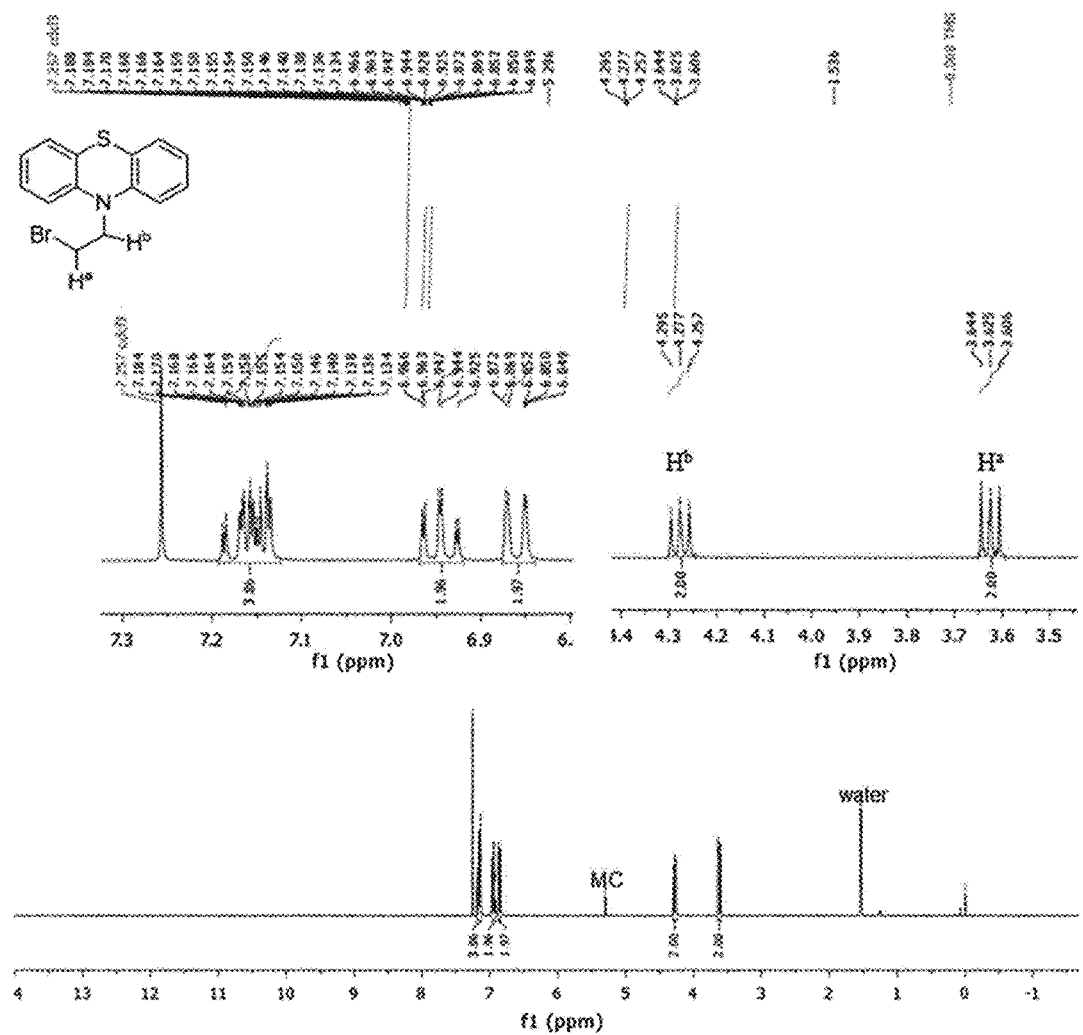
FIG. 3 is a $^1$H NMR spectrum of Compound 1-1 according to the present invention.
Figure 4:
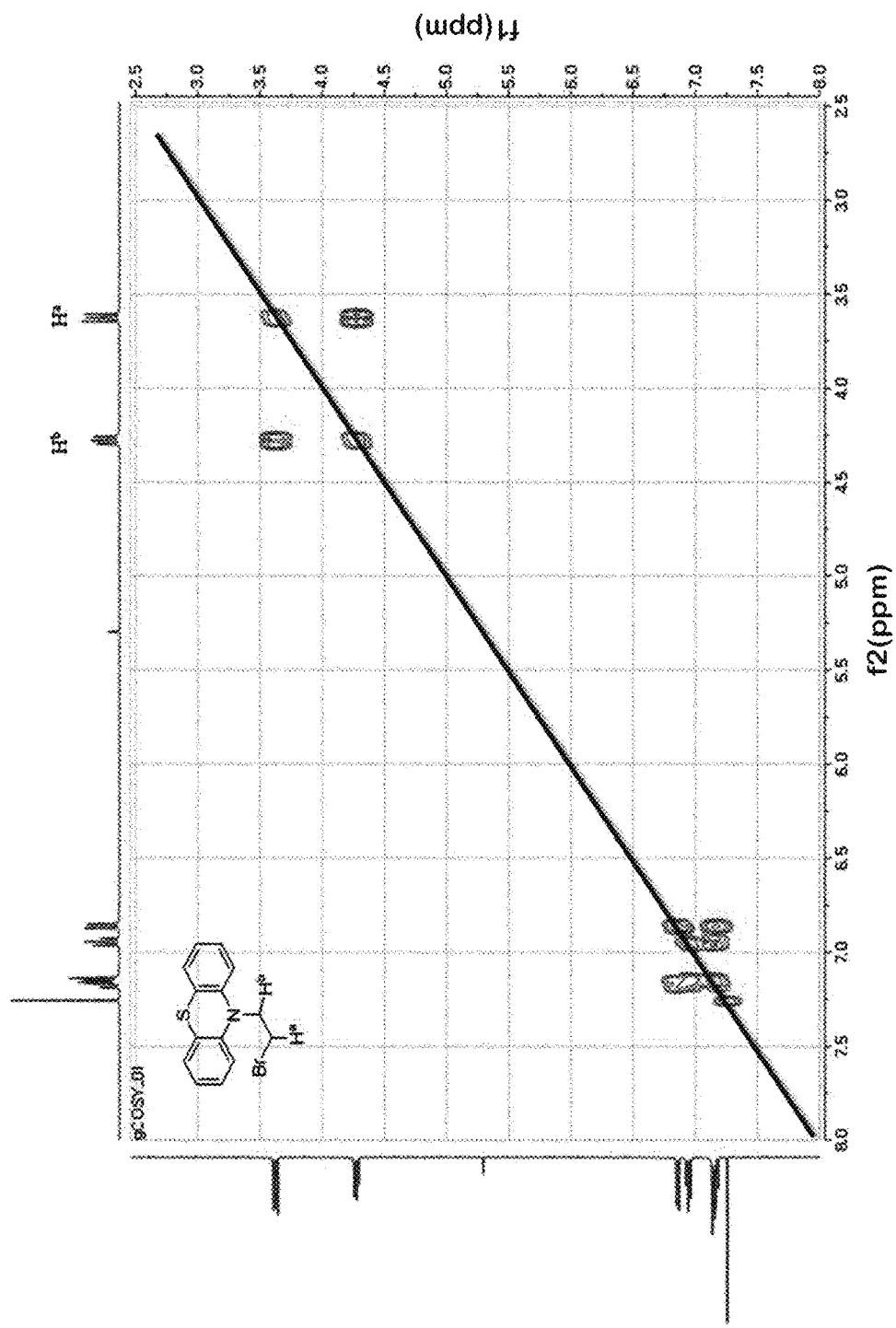
FIG. 4 is a $^1$H-$^1$H COZY NMR spectrum of Compound 1-1 according to the present invention.
Figure 5:
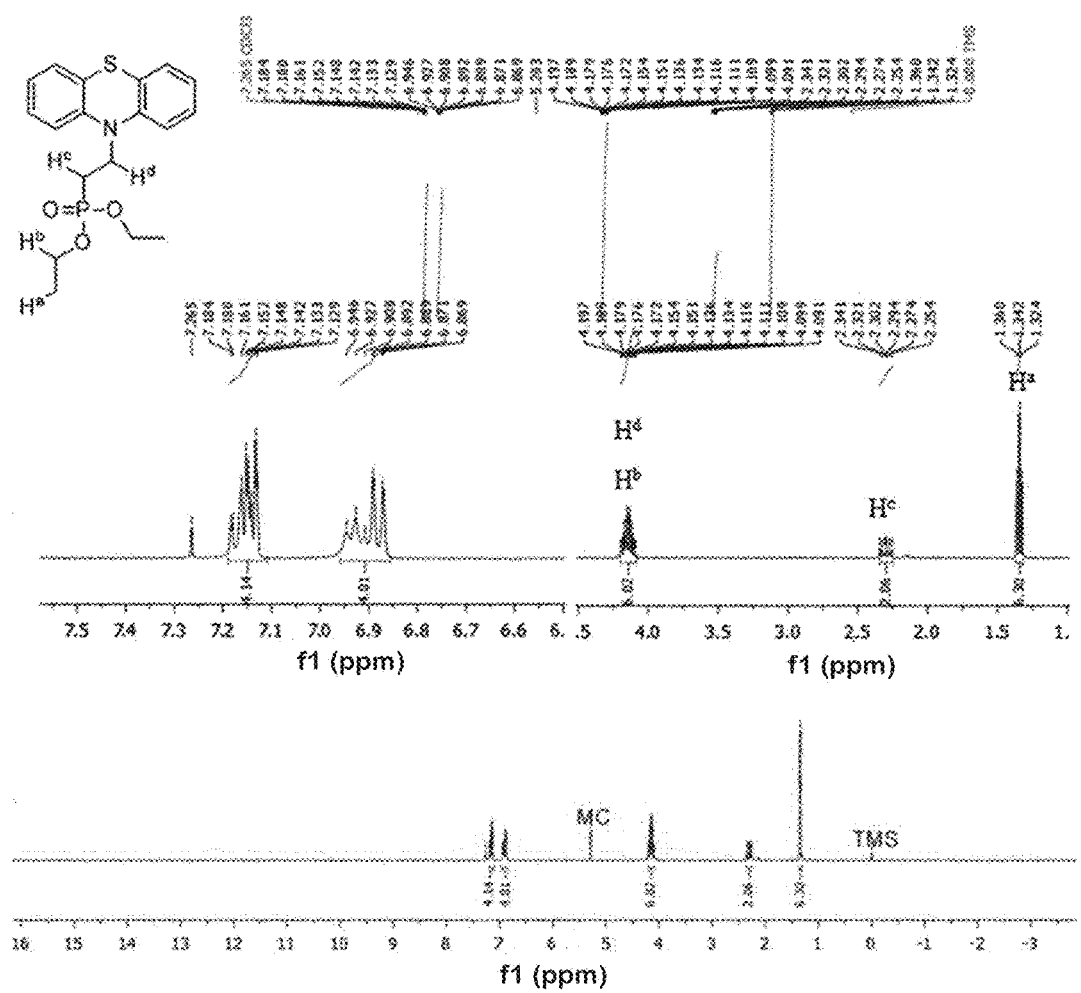
FIG. 5 is a $^1$H NMR spectrum of Compound 1-2 according to the present invention.
Figure 6:
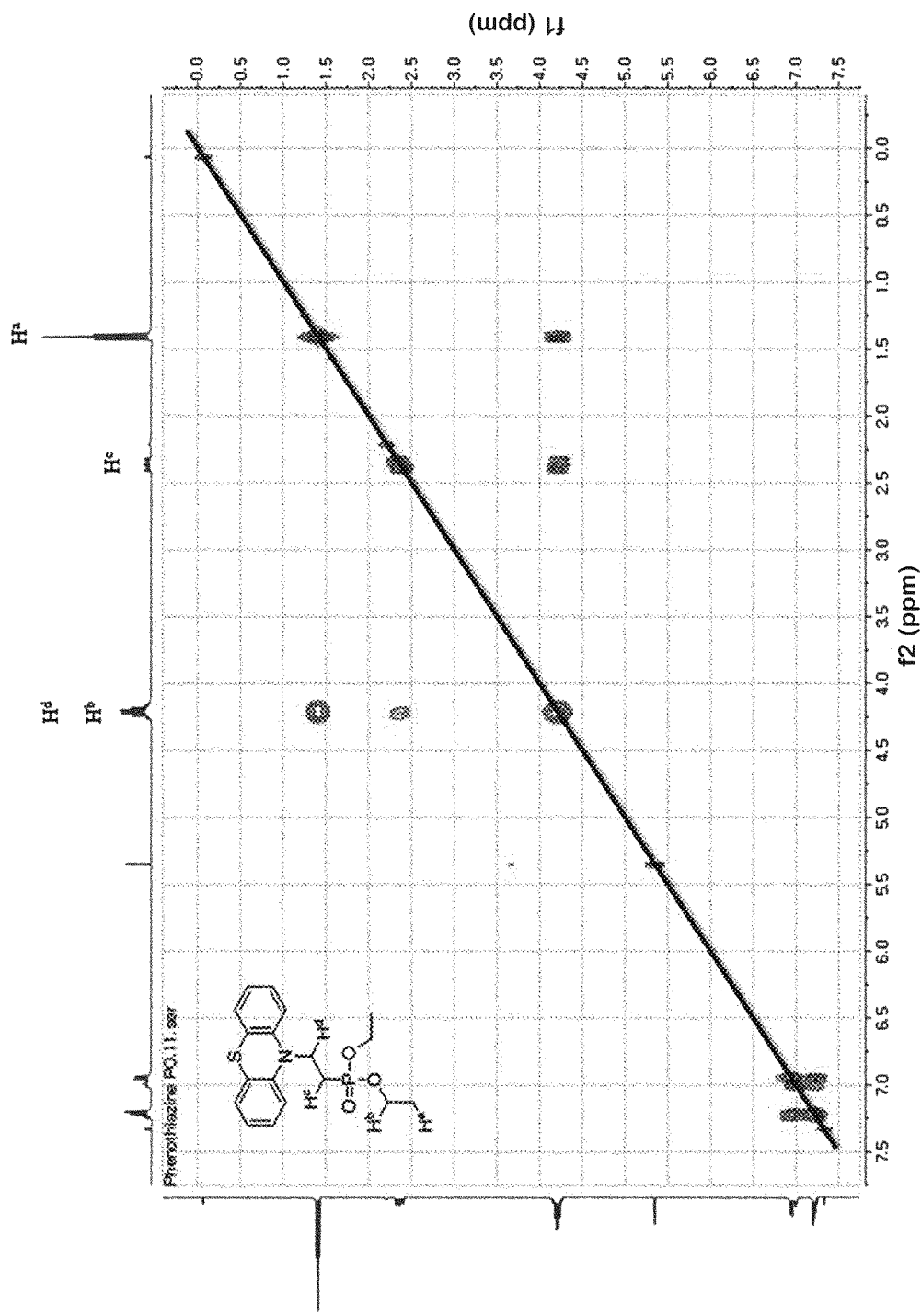
FIG. 6 is a $^1$H-$^1$H COZY NMR spectrum of Compound 1-2 according to the present invention.
Figure 7:
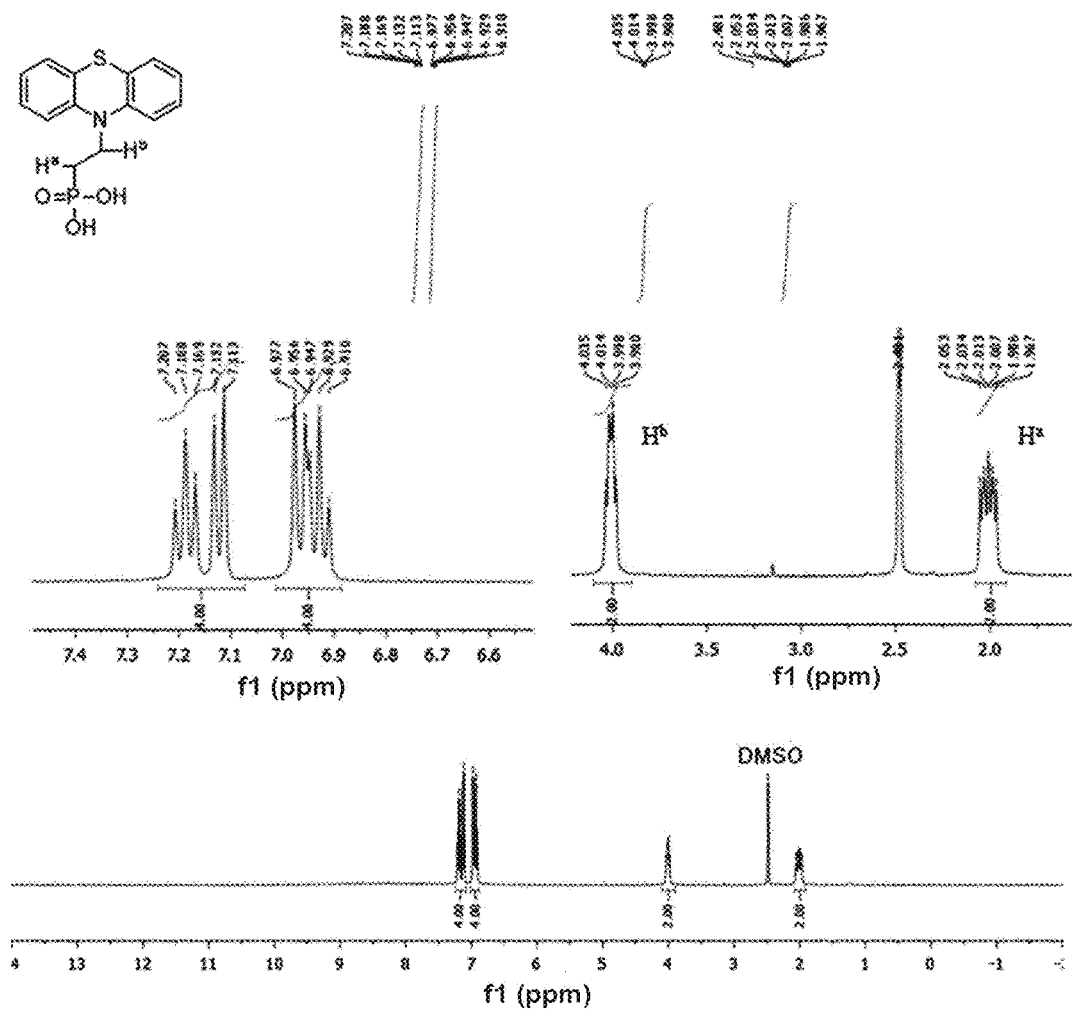
FIG. 7 is a $^1$H NMR spectrum of Compound 1-3 according to the present invention.
Figure 8:
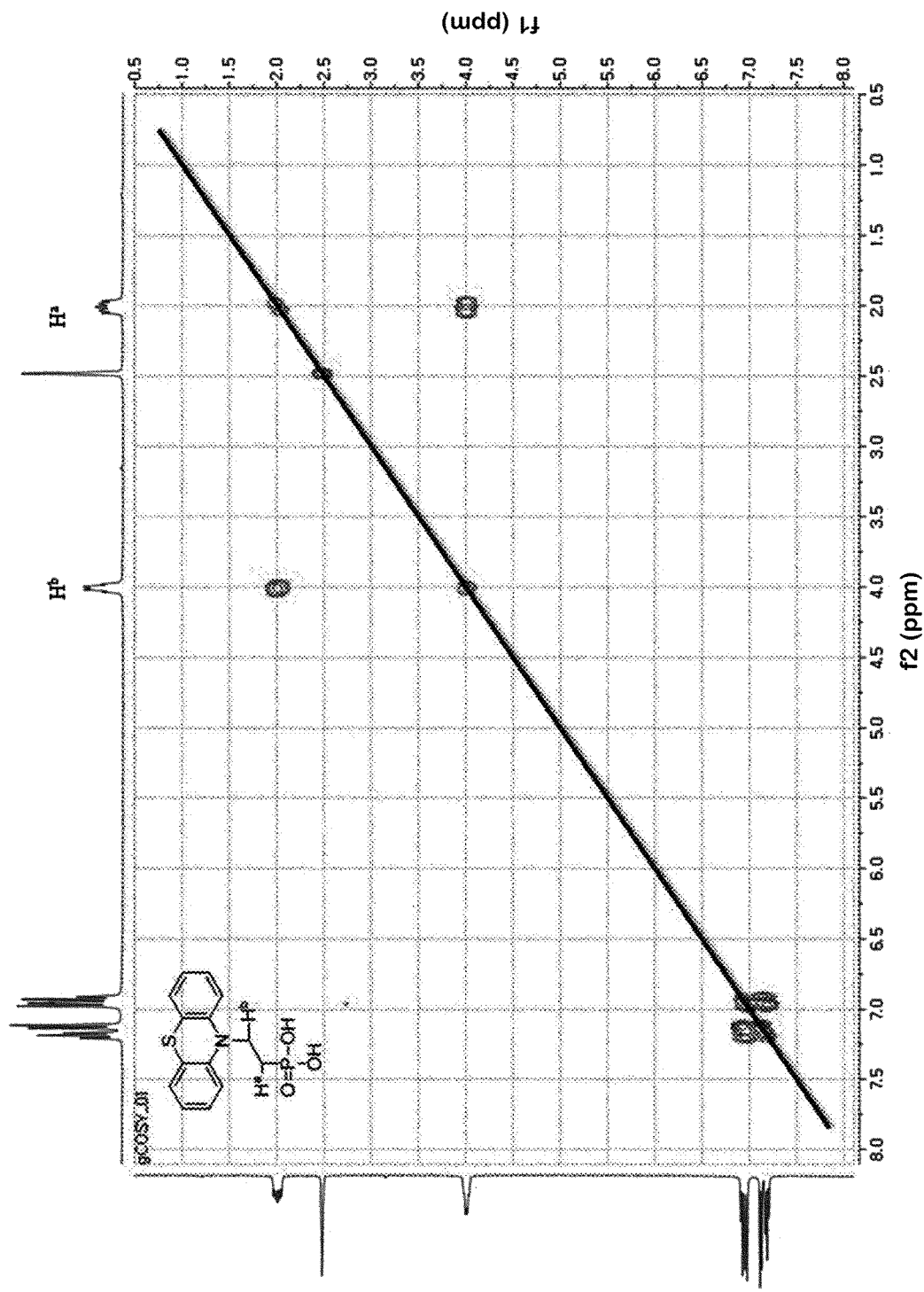
FIG. 8 is a $^1$H-$^1$H COZY NMR spectrum of Compound 1-3 according to the present invention.
Figure 9:
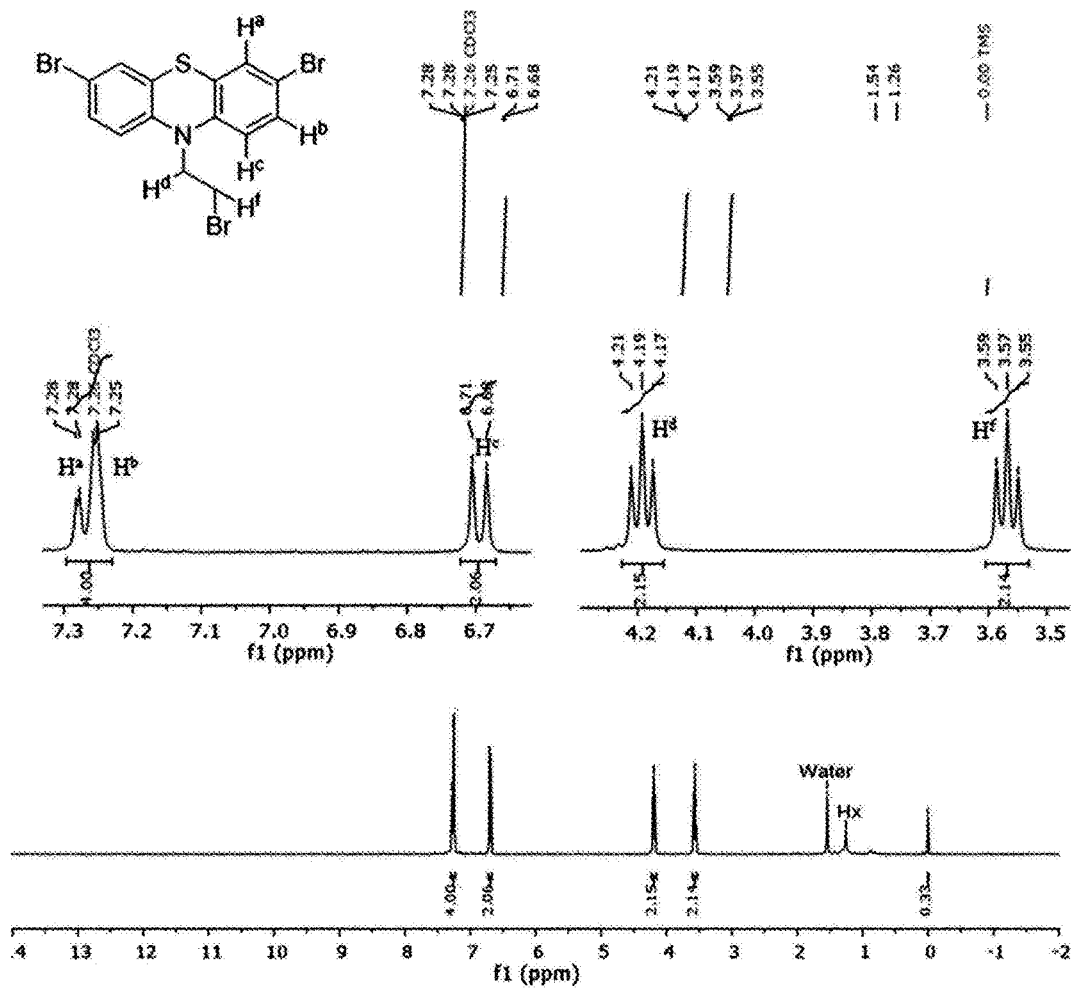
FIG. 9 is a $^1$H NMR spectrum of Compound 2-2 according to the present invention.
Figure 10:
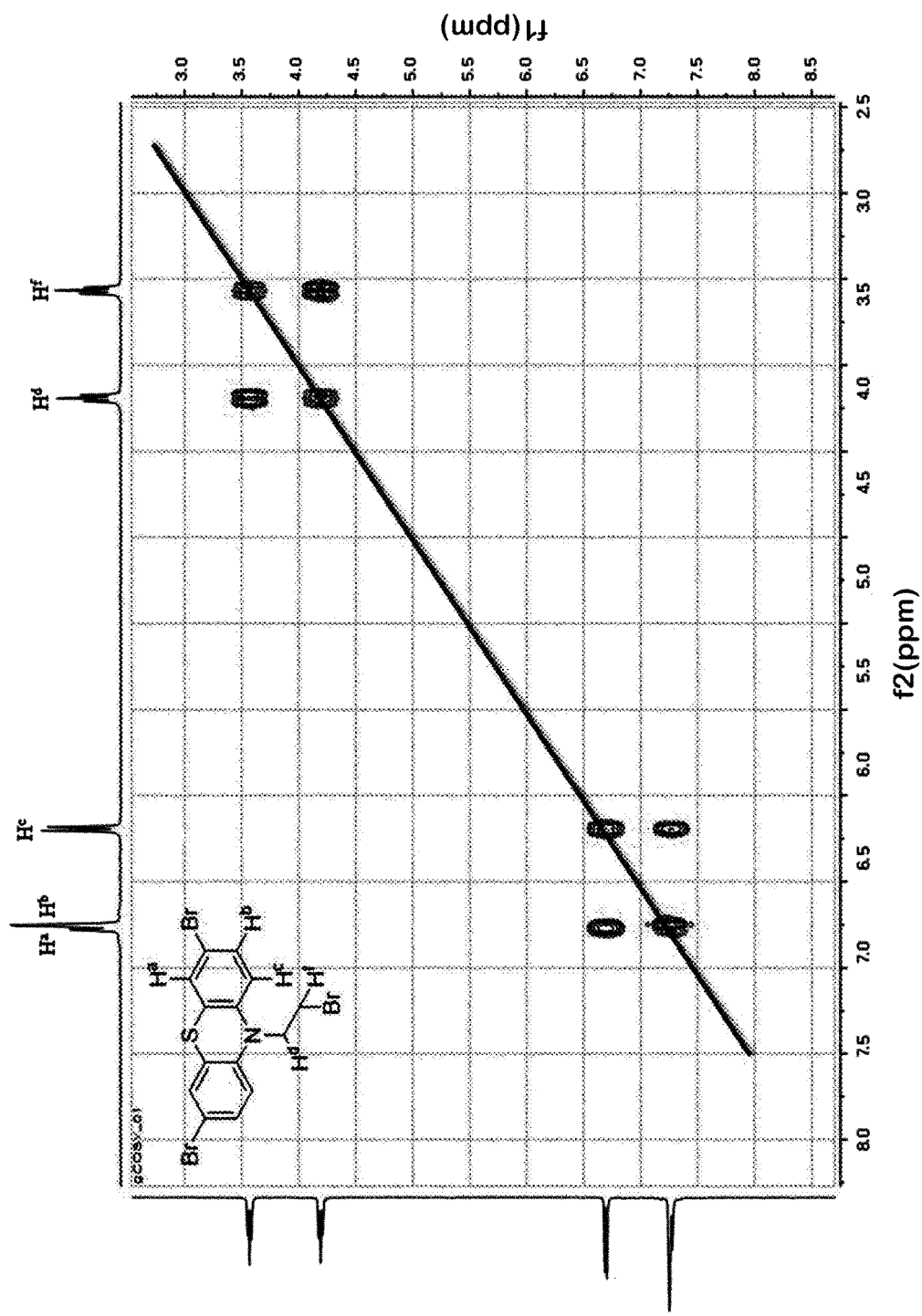
FIG. 10 is a $^1$H-$^1$H COZY NMR spectrum of Compound 2-2 according to the present invention.
Figure 11:
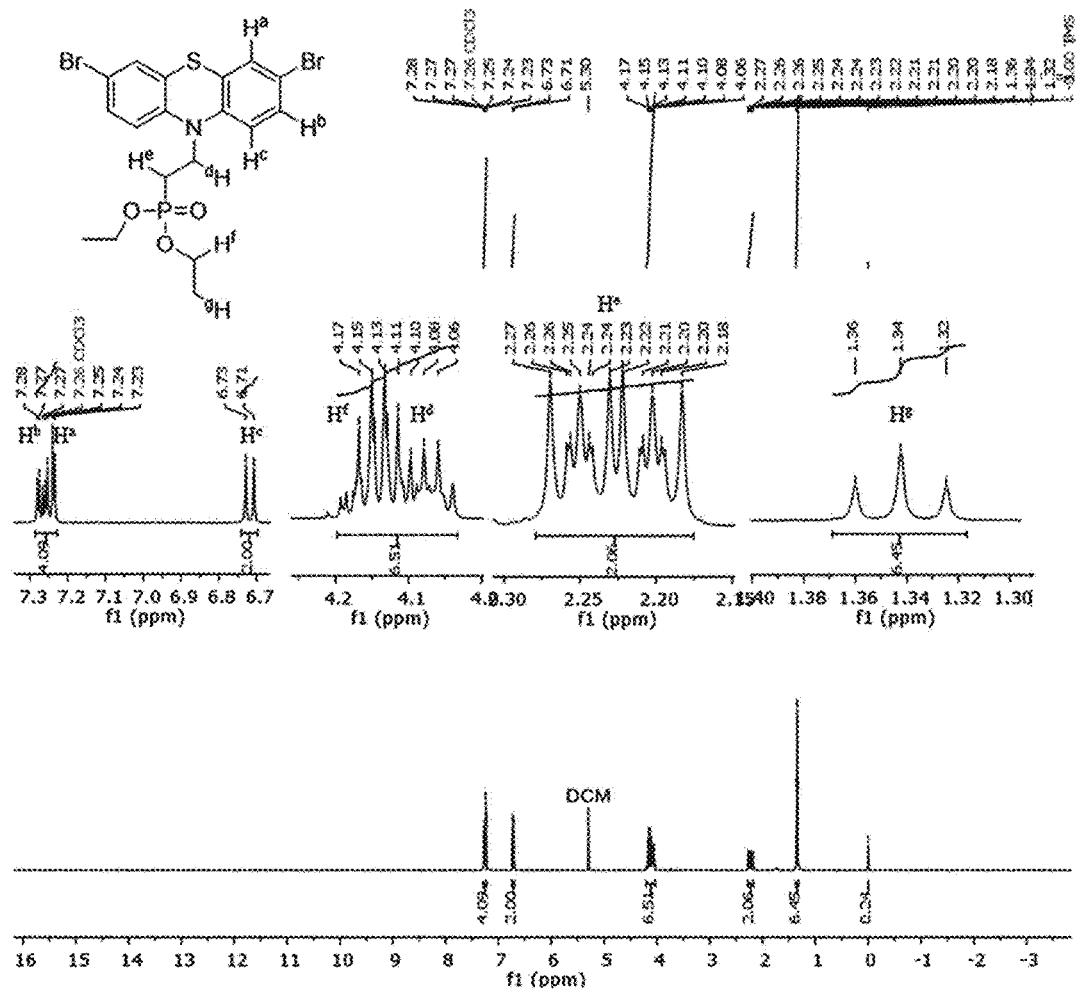
FIG. 11 is a $^1$H NMR spectrum of Compound 2-3 according to the present invention.
Figure 12:
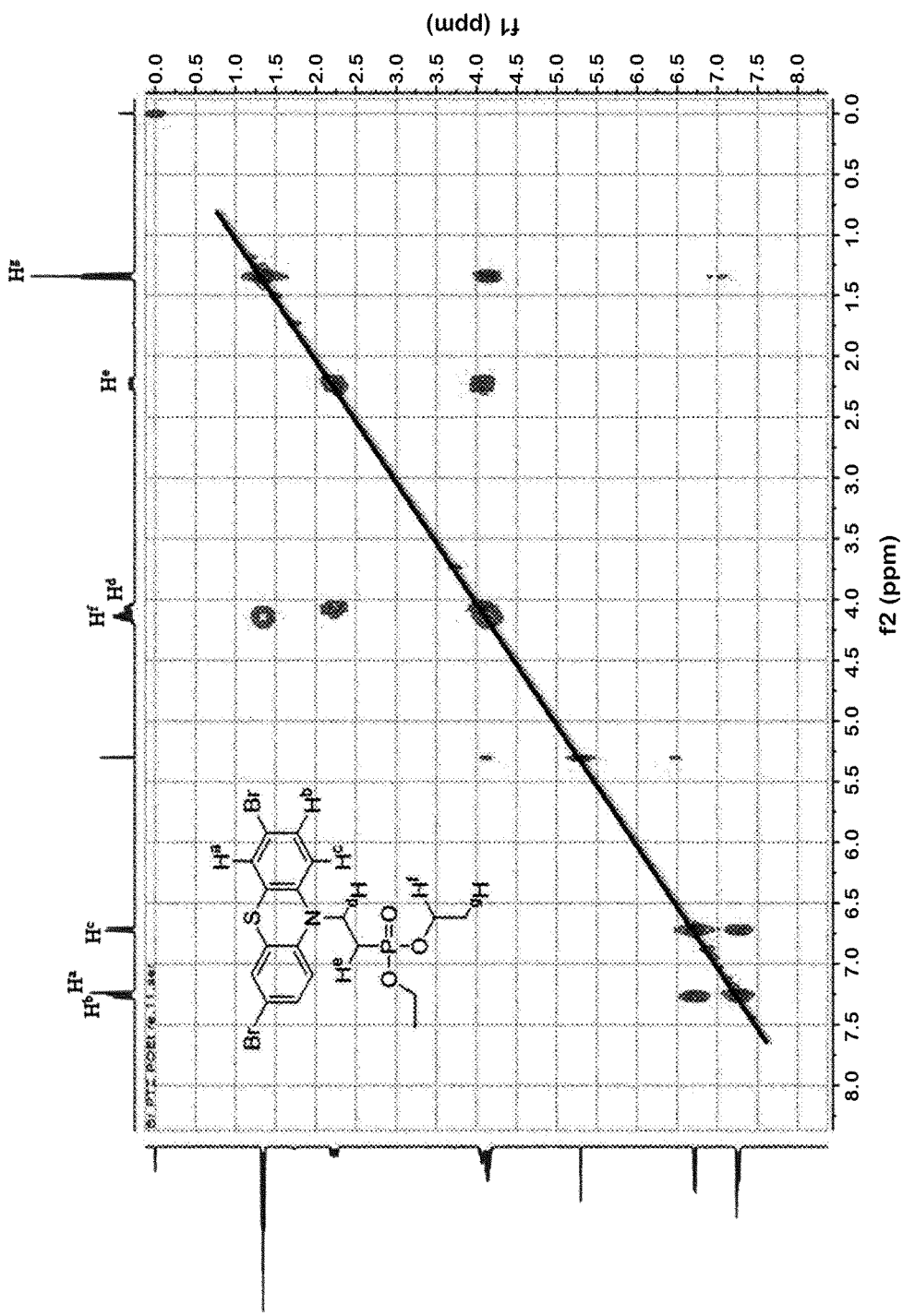
FIG. 12 is a $^1$H-$^1$H COZY NMR spectrum of Compound 2-3 according to the present invention.
Figure 13:
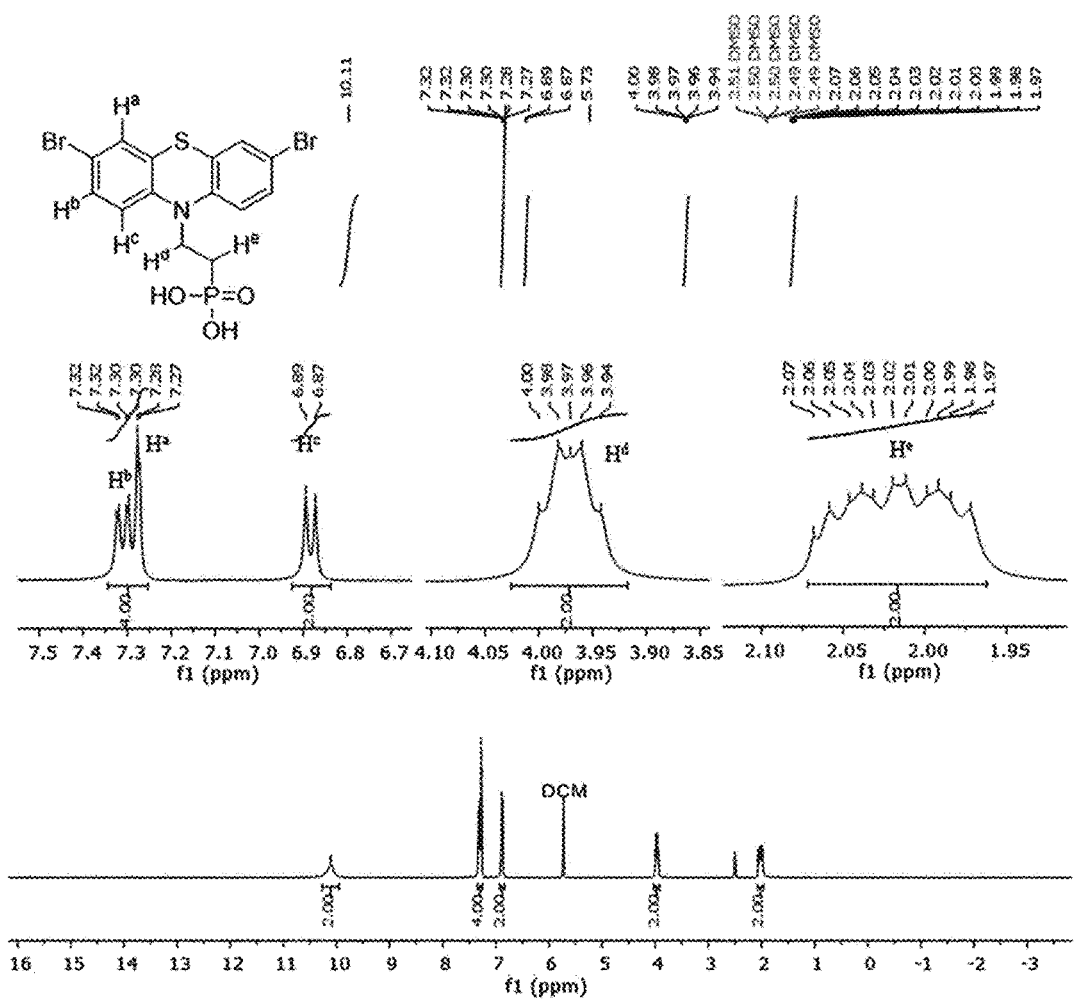
FIG. 13 is a $^1$H NMR spectrum of Compound 2-4 according to the present invention.
Figure 14:
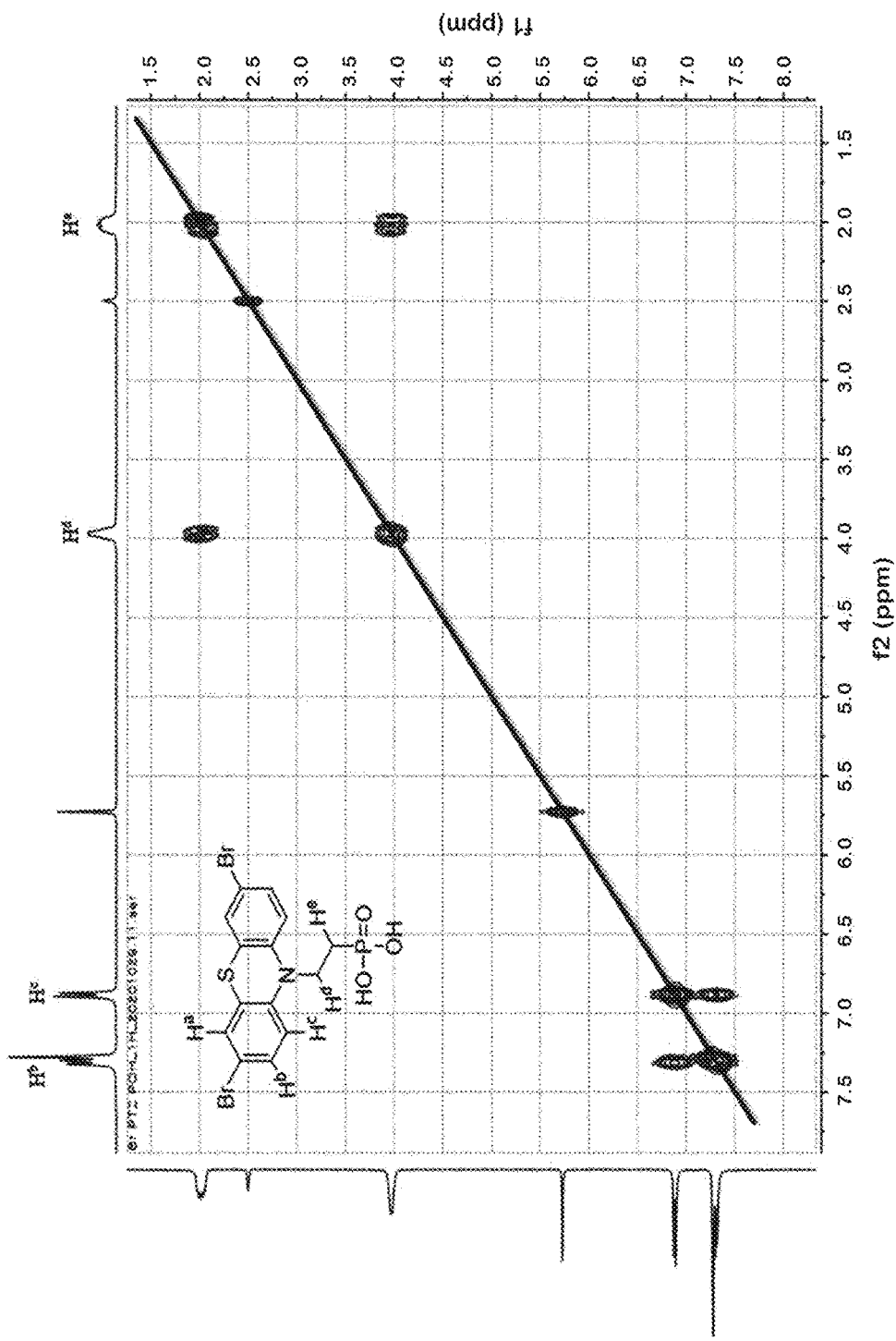
FIG. 14 is a $^1$H-$^1$H COZY NMR spectrum of Compound 2-4 according to the present invention.
Figure 15:
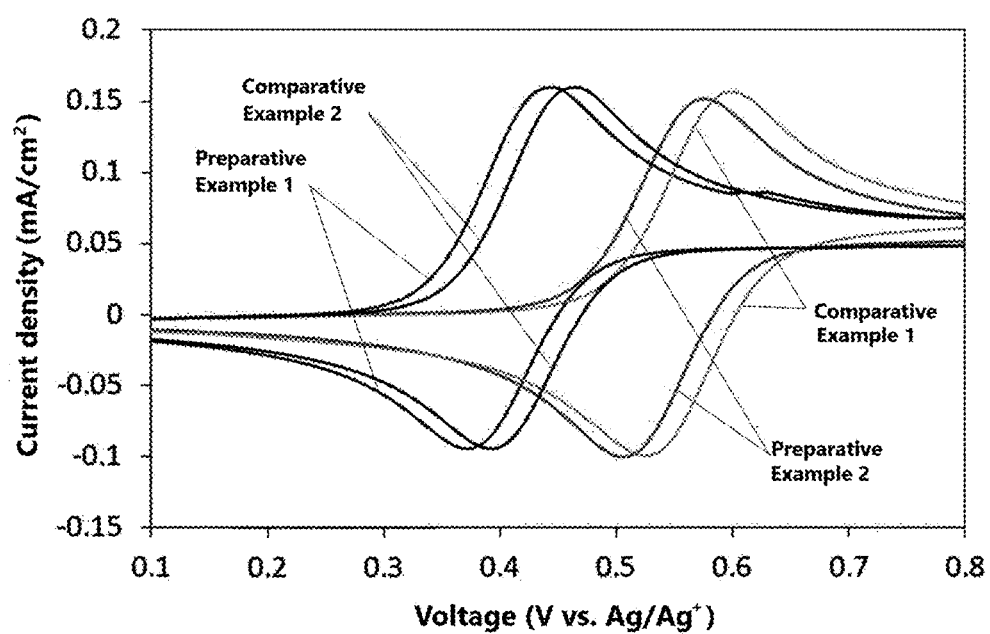
FIG. 15 shows cyclic voltammograms of compounds prepared in Preparative Examples 1-2 and Comparative Examples 1-2.
Figure 16:
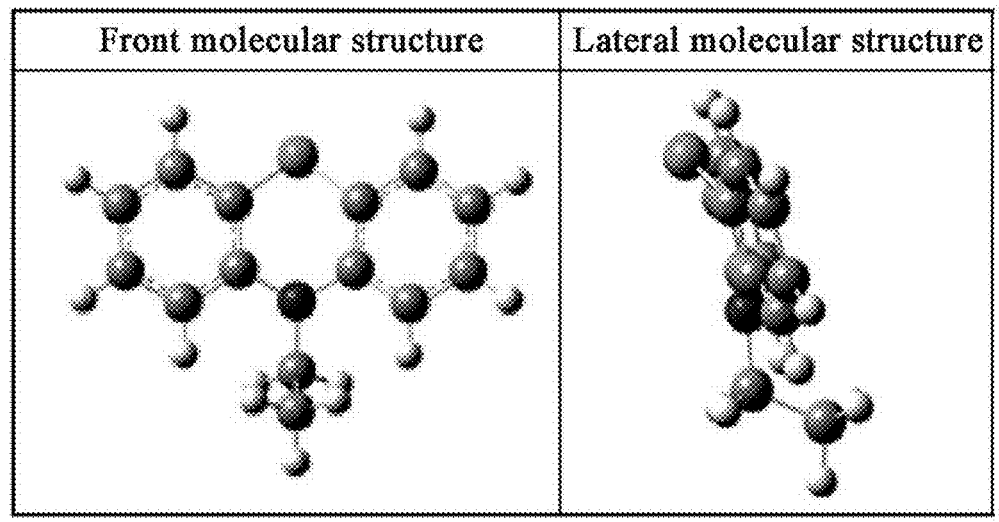
FIG. 16 illustrates front molecular structure and lateral molecular structure of Preparative Example 1.
Figure 17:
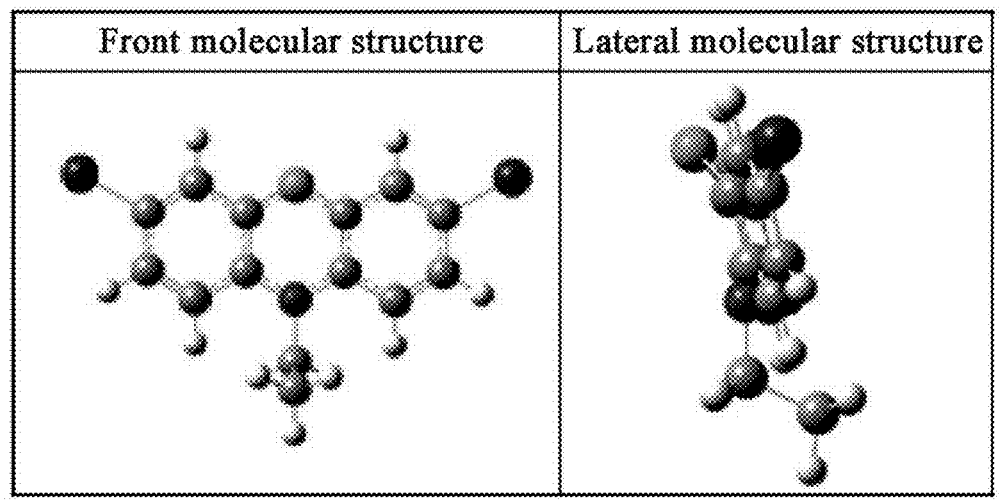
FIG. 17 illustrates front molecular structure and lateral molecular structure of Preparative Example 2.
Figure 18:
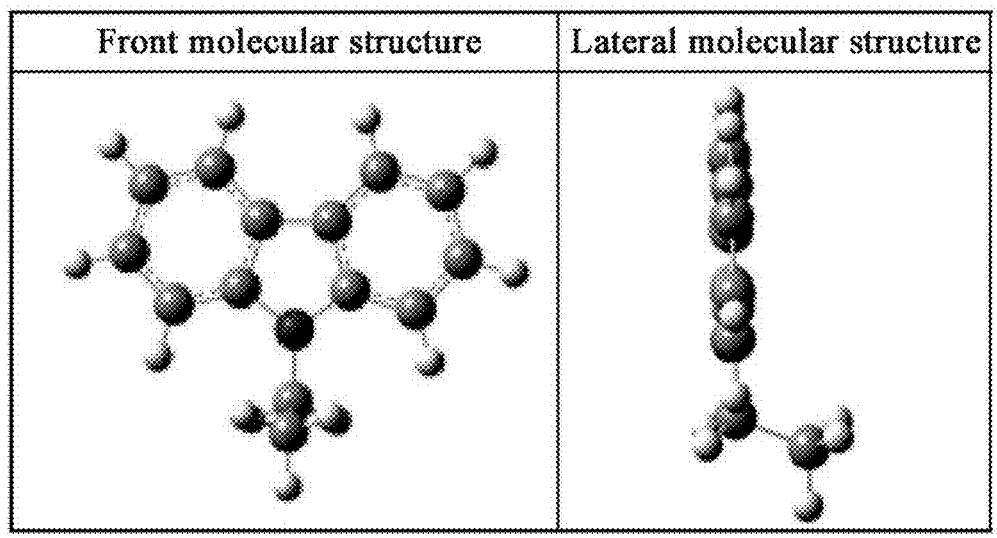
FIG. 18 illustrates front molecular structure and lateral molecular structure of Comparative Example 1.
Figure 19:
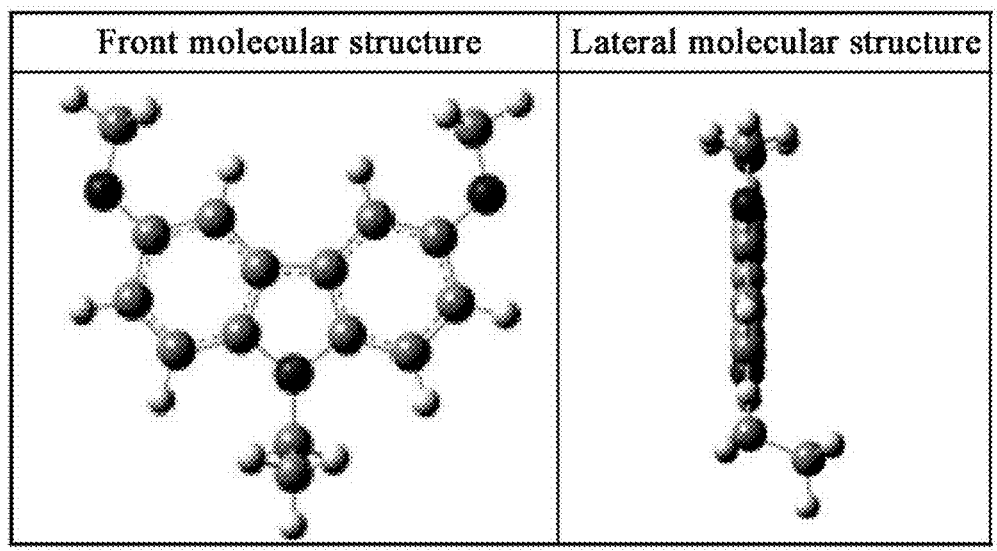
FIG. 19 illustrates front molecular structure and lateral molecular structure of Comparative Example 2.

FIG. 1 is a perspective view of a conductive substrate according to the present invention, FIG. 2 is a perspective view of a solar cell using a perovskite substrate of the present invention, FIG. 3 is a $^1$H NMR spectrum of Compound 1-1 according to the present invention, FIG. 4 is a $^1$H-$^1$H COZY NMR spectrum of Compound 1-1 according to the present invention, FIG. 5 is a $^1$H NMR spectrum of Compound 1-2 according to the present invention, FIG. 6 is a $^1$H-$^1$H COZY NMR spectrum of Compound 1-2 according to the present invention, FIG. 7 is a $^1$H NMR spectrum of Compound 1-3 according to the present invention, FIG. 8 is a $^1$H-$^1$H COZY NMR spectrum of Compound 1-3 according to the present invention, FIG. 9 is a $^1$H NMR spectrum of Compound 2-2 according to the present invention, FIG. 10 is a $^1$H-$^1$H COZY NMR spectrum of Compound 2-2 according to the present invention, FIG. 11 is a $^1$H NMR spectrum of Compound 2-3 according to the present invention, FIG. 12 is a $^1$H-$^1$H COZY NMR spectrum of Compound 2-3 according to the present invention, FIG. 13 is a $^1$H NMR spectrum of Compound 2-4 according to the present invention, FIG. 14 is a $^1$H-$^1$H COZY NMR spectrum of Compound 2-4 according to the present invention, and FIG. 15 shows cyclic voltammograms of compounds prepared in Preparative Examples 1-2 and Comparative Examples 1-2. The present invention will be described with reference to the FIGS. 1-15.

The conductive substrate of the present invention includes a conductive base and a conductive compound stacked on the conductive base, the conductive compound being represented by Formula 1:

<Formula 1>

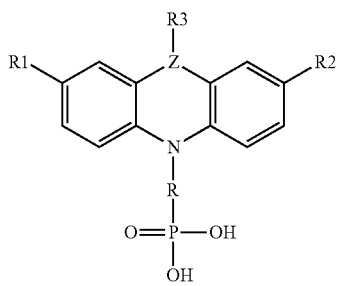

wherein Z is S, O or N, R is $CH2_n$ (n=1-10),

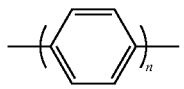

(n=1-4), R1 and R2 are each independently H, F, Cl, Br, I, CN, $NO_2$, alkyl chain, $OCH_3$, $NH_2$, $N(alkyl)_2$, $N(aromatic)_2$, $OCH2CH2_n$ (n=1-10),

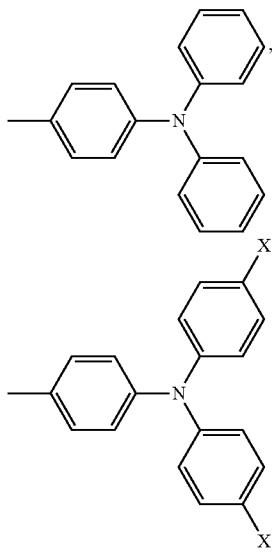

(X=H, F, Cl, Br, I, CN, $NO_2$, alkyl chain, $OCH_3$, $NH_2$ or $N(alkyl)_2$), and R3 is $CH2_n$ (n=1-10), $OCH2CH2_n$ (n=1-10),

(Y=F, Cl, Br, I, CN, $NO_2$, alkyl chain, $OCH_3$, $NH_2$, $N(alkyl)_2$ or

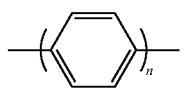

(n=1-4).

The conductive substrate of the present invention may further include a current carrying layer 120 deposited between the conductive base 100 and the conductive compound 110.

As long as the current carrying layer is electrically conductive, any material may be used without particular limitation for the current carrying layer. For example, when the conductive base is made of a glass, plastic or polymeric material because transparency is required, the current carrying layer may be formed by depositing an oxide such as indium tin oxide (ITO) or fluorine-doped tin oxide (FTO) on the conductive base by a physical or chemical vapor deposition process.

The conductive compound may form a self-assembled monolayer (SAM). The term "self-assembled monolayer (SAM)" refers to a film of regularly aligned organic molecules that can be stacked and spontaneously coated on the surface of a base. The self-assembled monolayer can be used as a hole transport layer.

The conductive compound may have a dipole moment of 0.1 to 6. The electric dipole moment is expressed as the product of the distance between a positive charge and a negative charge spaced a distance from each other and the quantity of the electric charges. The difference in energy between the work function of the conductive base and the valence band of a perovskite absorber layer is greater than that required for hole transport. This energy difference acts as a factor that lowers the open circuit voltage of a solar cell to deteriorate the efficiency of the solar cell. Thus, a reduction in the energy difference will improve the efficiency of a solar cell. If the dipole moment is less than 0.1, the effect of the difference in energy between the work function of the conductive base and the valence band of a perovskite absorber layer may be insignificant. Meanwhile, if the dipole moment exceeds 6, the work function of the conductive base may be much lower than the energy of the valence band of a perovskite absorber layer, with the result that efficient hole transport is impeded.

The conductive compound may be a hole transport material that is in close contact with the current carrying layer. In this case, the conductive compound may be used, for example, in solar cell applications, as well as light emitting devices, X-ray detectors, photodetectors, memories, rectifiers, transistors, thermoelectric elements, and piezoelectric elements, when stacked with a perovskite thin film.

The present invention also provides a perovskite substrate including the conductive substrate and a perovskite layer 130 stacked on the conductive substrate. The perovskite substrate significantly reduces the difference between the forward and reverse conversion efficiencies (hysteresis index) when a current is applied thereto.

Due to its hysteresis-controlled electrical properties, the perovskite substrate can be used in a variety of applications. For example, the perovskite substrate may be used in a variety of applications due to its ability to improve the lifetime of a perovskite solar cell, to accurately measure the efficiency of a perovskite solar cell, and to prevent non-radiative recombination to increase the efficiency of a light emitting diode (LED).

The present invention also provides a solar cell using the perovskite substrate. Based on the significantly reduced difference between forward and reverse conversion efficiencies, the photoelectric conversion efficiency of the solar cell can be greatly enhanced. Hysteresis is caused by various factors, one of which is that electrons and holes generated in the perovskite absorber layer by light are extracted in an electron transport layer and a hole transport layer at different rates, respectively, to produce a capacitor effect at the perovskite absorber layer/electron transport layer interface or the perovskite absorber layer/hole transport layer interface. In the solar cell of the present invention, the charge extraction rates can be increased to significantly reduce the hysteresis effect.

The solar cell of the present invention can be fabricated by sequentially stacking the conductive compound (SAM) 110 for a hole transport layer, the perovskite layer 130, an electron transport layer (ETL) 140, and a counter electrode 150 on the conductive base (TCO) 100.

When transparency is required, a current carrying metal oxide material such as ITO or FTO is deposited on the conductive base 100 made of a glass, plastic or polymeric material, as mentioned above, and a hole transport layer is stacked thereon. The perovskite layer 130 stacked on the conductive base 100 is formed of a perovskite material and the electron transport layer 140 is stacked thereon. For electron transfer efficiency and durability, the electron transport layer 140 may be formed by separately stacking fullerene (C60) 142 and BCP 144 on the perovskite layer 130. The counter electrode 150 stacked on the electron transport layer 140 is made of a low resistance material such as silver or gold.

It should be understood that the electron transport layer may use a material containing fine particles, such as titanium dioxide or tin oxide, to increase its surface area, with the result that the perovskite material can be densely packed over a large area to achieve improved current carrying efficiency.

Preparative Example 1: Preparation of the Compound of Formula 2

The SAM compound of Formula 2 was synthetically prepared according to Scheme 1.

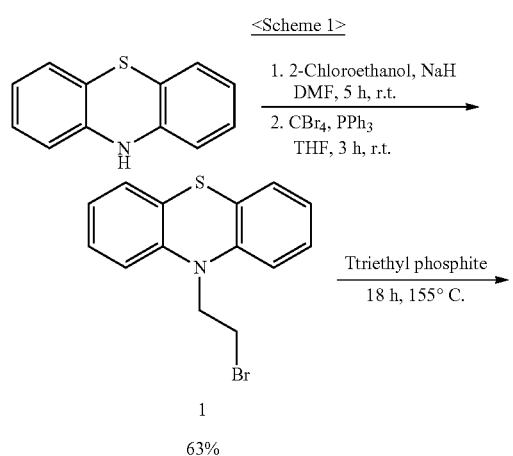

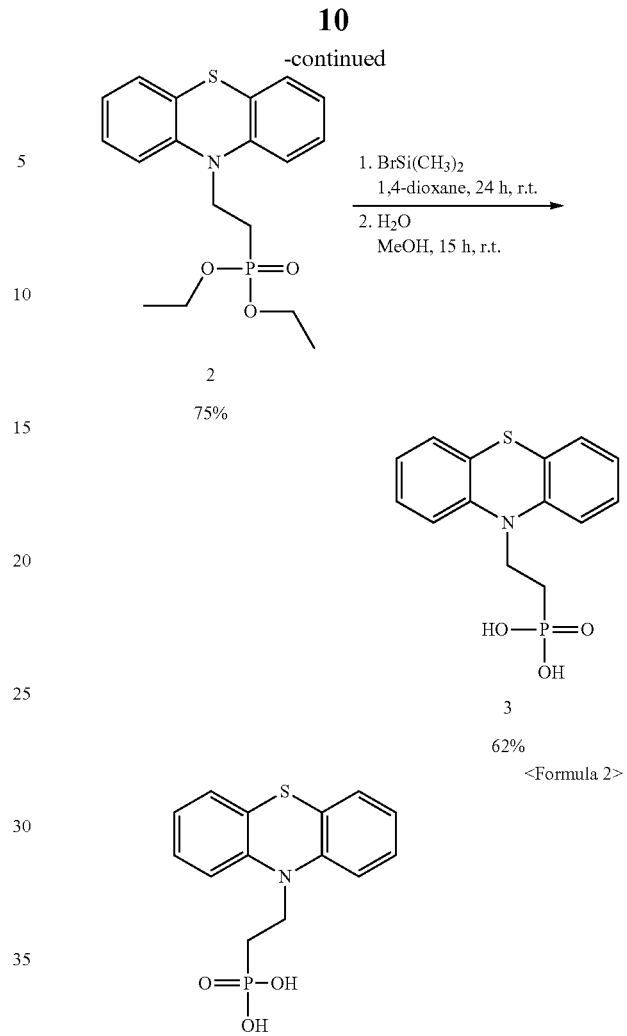

The chemical names of the compounds shown in Scheme 1 are as follows: 1-1. 10-(2-bromoethyl)-10H-phenothiazine, 1-2. diethyl(2-(10H-phenothiazin-10-yl)ethyl)phosphonate, 1-3. (2-(10H-phenothiazin-10-yl)ethyl)phosphonic acid.

Preparative Example 1-1: Preparation of 10-(2-bromoethyl)-10H-phenothiazine

Hexane was used for oil removal from a solution of 60% sodium hydride (3.60 g, 90.0 mmol) in oil under argon gas, followed by the addition of N,N-dimethylformamide (20 mL).

A solution of phenothiazine (6.00 g, 30.1 mmol) in N,N-dimethylformamide (12 mL) was slowly added to the sodium hydride solution. After stirring, the reaction solution was heated to 60° C. and 2-chloroethanol (6.0 mL, 89 mmol) was added thereto. Thereafter, the reaction temperature was again lowered to room temperature, at which stirring was conducted for 5 h. The reaction was quenched with methanol, followed by extraction with ethyl acetate.

The organic layer was dried over sodium sulfate, the solvent was removed using a rotary evaporator, and the residue and triphenyl phosphine (10.49 g, 39.99 mmol) were dissolved in tetrahydrofuran (40 mL) under argon gas.

To the resulting solution was added dropwise a solution of carbon tetrabromide (13.27 g, 40.01 mmol) in tetrahydrofuran (15 mL). The mixture was stirred for 3 h. After completion of the reaction, the reaction mixture was evaporated using a rotary evaporator to remove tetrahydrofuran and extracted with methylene chloride.

The organic layer was dried over sodium sulfate, the solvent was removed using a rotary evaporator, and the residue was purified by column chromatography (eluent: hexane/ethyl acetate 100/0-90/10) to afford Compound 1-1 (4.88 g, 53%).

$^1$H NMR (ppm, 400 MHz, CDCl$_3$) δ 7.18-7.13 (m, 4H), 6.95 (td, J=7.4, 1.2 Hz, 2H), 6.61 (dd, J=8.1, 1.0 Hz, 2H), 4.28 (t, J=7.5 Hz, 2H), 3.63 (t, J=7.8 Hz, 2H).

<Structural formula of Compound 1-1>

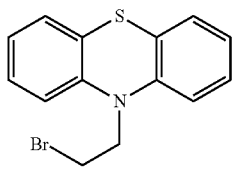

Preparative Example 1-2: Preparation of diethyl(2-(10H-phenothiazin-10-yl)ethyl)phosphonate Compound 1-1 (0.31 g, 1.0 mmol) was dissolved in triethyl phosphite (0.86 mL, 5.0 mmol). The solution was stirred under reflux for 18 h.

After completion of the reaction, the reaction solution was evaporated using a rotary evaporator to remove triethyl phosphite. The residue was purified by column chromatography (eluent: hexane/ethyl acetate 100/0-10/90) to afford Compound 1-2 (0.27 g, 75%).

$^1$H NMR (ppm, 400 MHz, CDCl$_3$) δ 7.18-7.13 (m, 4H), 6.95-6.87 (m, 4H), 4.20-4.09 (m, 6H), 2.34-2.25 (m, 2H), 1.34 (t, J=7.1 Hz, 6H); $^{13}$C NMR (ppm, 101 MHz, CDCl$_3$) δ 144.4, 127.5, 127.4, 125.0, 122.8, 115.1, 61.9 (d, J=6.1 Hz), 41.2, 24.3 (d, J=138.4 Hz), 16.5 (d, J=6.1 Hz); $^{31}$P NMR (ppm, 162 MHz, CDCl$_3$) δ 28.69; HRMS m/z calcd for C$_{18}$H$_{22}$NO$_3$PS [M+Na]$^+$ 386.0950, found 386.0952 (Δ=0.5 ppm).

<Structural formula of Compound 1-2>

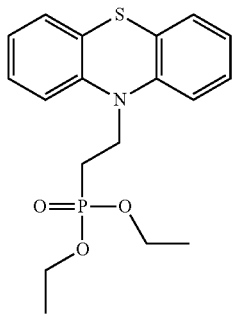

Preparative Example 1-3: Preparation of (2-(10H-phenothiazin-10-yl)ethyl)phosphonic acid Compound 1-2 (0.61 g, 1.7 mmol) was dissolved in 1,4-dioxane under argon gas and then bromotrimethylsilane (2.6 mL, 20 mmol) was slowly added thereto. The mixture was stirred for 24 h. After completion of the reaction, the reaction mixture was evaporated using a rotary evaporator to remove the solvent.

The resulting solid residue was dissolved in methanol. Distilled water was slowly added until the solution became opaque. The mixture was stirred for 15 h. The precipitate was collected by filtration with water to afford Compound 1-3 (0.32 g, 62%).

$^1$H NMR (ppm, 400 MHz, (CD$_3$)$_2$SO) δ 7.21-7.11 (m, 4H), 6.98-6.91 (m, 4H), 4.04-3.98 (m, 2H), 2.05-1.97 (m, 2H); $^{13}$C NMR (ppm, 101 MHz, (CD$_3$)$_2$SO) δ 143.9, 127.7, 127.1, 122.9, 122.6, 115.2, 41.8, 25.9 (d, J=131.3 Hz); $^{31}$P NMR (ppm, 162 MHz, (CD$_3$)$_2$SO) δ 22.37; HRMS m/z calcd for C$_{14}$H$_{15}$NO$_3$PS [M+H]$^+$ 308.0510, found 308.0506 (Δ=1.3 ppm).

<Structural formula of Compound 1-3>

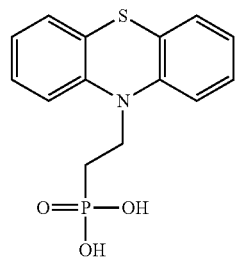

Preparative Example 2: Preparation of the Compound of Formula 3

The SAM compound of Formula 3 was synthetically prepared according to Scheme 2.

<Scheme 2>

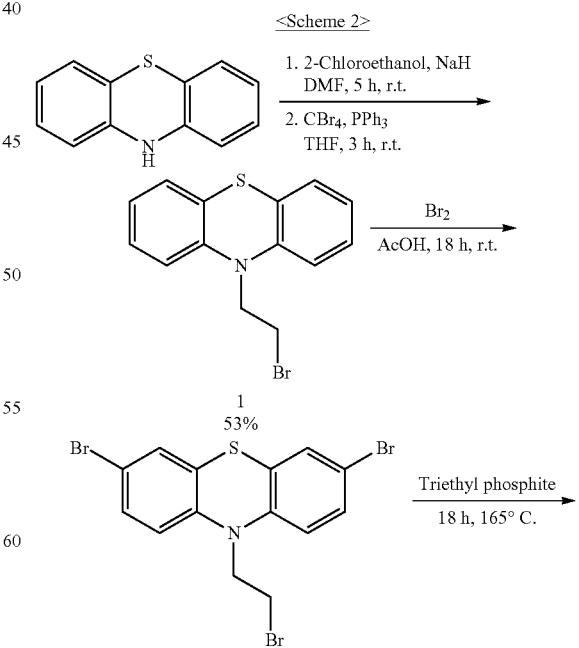

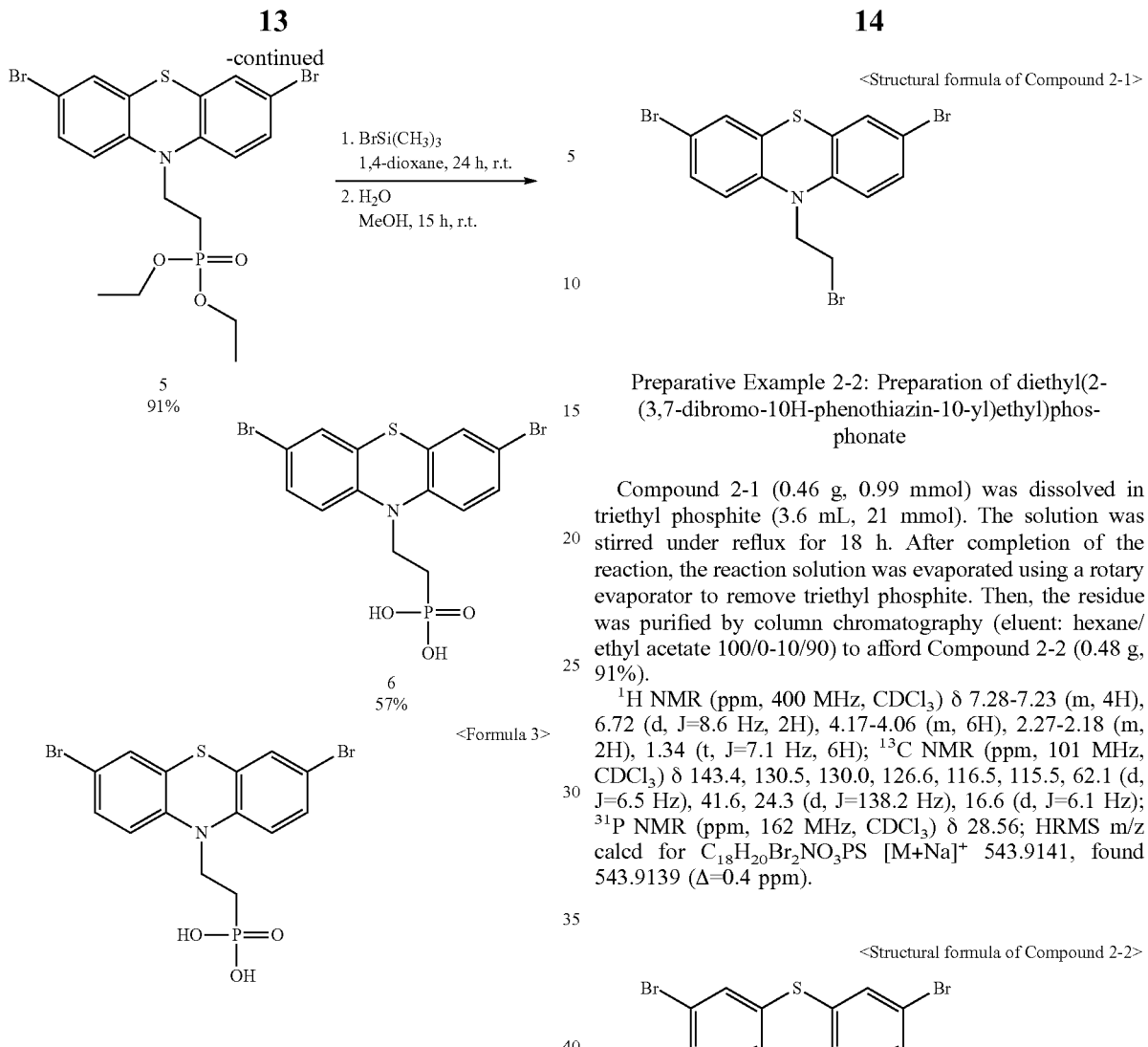

The chemical names of the compounds shown in Scheme 2 are as follows: 2-1. 10-(2-bromoethyl)-10H-phenothiazine, 2-2. 3,7-dibromo-10-(2-bromoethyl)-10H-phenothiazine, 2-3. diethyl(2-(3,7-dibromo-10H-phenothiazin-10-yl)ethyl)phosphonate, 2-4. (2-(3,7-dibromo-10H-phenothiazin-10-yl)ethyl)phosphonic acid Preparation 2-1: Preparation of 3,7-dibromo-10-(2-bromoethyl)-10H-phenothiazine Compound 1-1 (4.58 g, 15.0 mmol) was dissolved in acetic acid (200 ml), followed by stirring. To the reaction solution was slowly added a dilute solution of bromine (2.3 mL, 45 mmol) in acetic acid (50 mL).

The reaction was quenched with sodium hydrogen sulfite, followed by extraction with ethyl acetate. The organic layer was dried over sodium sulfate and the solvent was removed with a rotary evaporator. The residue was purified by column chromatography (eluent: hexane/ethyl acetate 100/0-90/10) to afford Compound 2-2 (4.64 g, 67%).

$^1$H NMR (ppm, 400 MHz, CDCl$_3$) δ 7.26 (d, J=10.7 Hz, 4H), 6.69 (d, J=8.4 Hz, 2H), 4.19 (t, J=7.4 Hz, 2H), 3.57 (t, J=7.4 Hz, 2H); $^{13}$C NMR (ppm, 101 MHz, CDCl$_3$) δ 143.0, 130.4, 130.0, 127.0, 116.5, 115.6, 49.5, 27.2.

Preparative Example 2-2: Preparation of diethyl(2-(3,7-dibromo-10H-phenothiazin-10-yl)ethyl)phosphonate Compound 2-1 (0.46 g, 0.99 mmol) was dissolved in triethyl phosphite (3.6 mL, 21 mmol). The solution was stirred under reflux for 18 h. After completion of the reaction, the reaction solution was evaporated using a rotary evaporator to remove triethyl phosphite. Then, the residue was purified by column chromatography (eluent: hexane/ethyl acetate 100/0-10/90) to afford Compound 2-2 (0.48 g, 91%).

$^1$H NMR (ppm, 400 MHz, CDCl$_3$) δ 7.28-7.23 (m, 4H), 6.72 (d, J=8.6 Hz, 2H), 4.17-4.06 (m, 6H), 2.27-2.18 (m, 2H), 1.34 (t, J=7.1 Hz, 6H); $^{13}$C NMR (ppm, 101 MHz, CDCl$_3$) δ 143.4, 130.5, 130.0, 126.6, 116.5, 115.5, 62.1 (d, J=6.5 Hz), 41.6, 24.3 (d, J=138.2 Hz), 16.6 (d, J=6.1 Hz); $^{31}$P NMR (ppm, 162 MHz, CDCl$_3$) δ 28.56; HRMS m/z calcd for C$_{18}$H$_{20}$Br$_2$NO$_3$PS [M+Na]$^+$ 543.9141, found 543.9139 (Δ=0.4 ppm).

Preparation 2-3: Preparation of (2-(3,7-Dibromo-10H-phenothiazin-10-yl)ethyl)phosphonic acid Compound 2-2 (1.55 g, 2.97 mmol) was dissolved in 1,4-dioxane under argon gas, and then bromotrimethylsilane (4.0 mL, 30 mmol) was slowly added thereto. The mixture was stirred for 24 h. After completion of the reaction, the reaction mixture was evaporated using a rotary evaporator to remove the solvent.

The resulting solid residue was dissolved in methanol. Distilled water was slowly added until the solution became opaque. The mixture was stirred for 15 h. The precipitate was collected by filtration with water to afford Compound 2-3 (0.80 g, 57%).

$^1$H NMR (ppm, 400 MHz, (CD$_3$)$_2$SO) δ 7.32-7.27 (m, 4H), 6.88 (d, J=8.7 Hz, 2H), 4.00-3.94 (m, 2H), 2.07-1.97

(m, 2H); $^{13}$C NMR (ppm, 101 MHz, $(CD_3)_2SO$) δ 143.0, 130.4, 129.0, 124.9, 116.9, 114.3, 42.1, 25.5 (d, J=131.0 Hz); $^{31}$P NMR (ppm, 162 MHz, $(CD_3)_2SO$) δ 22.48; HRMS m/z calcd for $C_{14}H_{12}NO_3PS$ [M−H]$^-$ 461.8569, found 461.8573 (Δ=0.9 ppm).

<Structural formula of Compound 2-3>

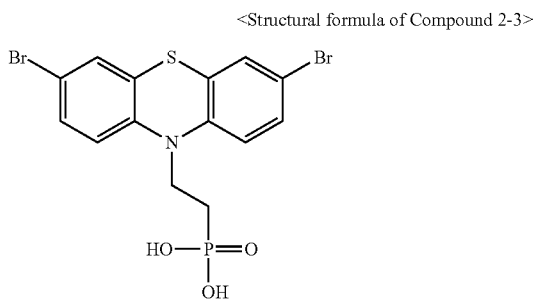 [SMILES: O=P(O)(O)CCN1c2ccc(Br)cc2Sc2cc(Br)ccc21]

Experimental Example 1

Computational chemistry was used to determine the dipole moments of the molecules of the compounds synthesized in Preparative Examples 1-2 and the already known compounds 2-PACz (Comparative Example 1) and MeO-2PACz (Comparative Example 2). Density functional theory (DFT) calculation was carried out using the def2-SVP basis set and the B3LYP methodology. The results are shown in Table 1.

<Structural formula of 2-PACz>

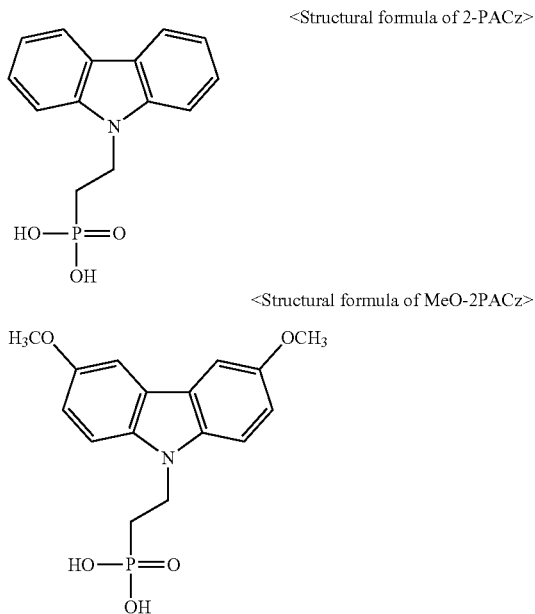

<Structural formula of MeO-2PACz>

TABLE 1

|  | Dipole moment (Debye) |
| --- | --- |
| Preparative Example 1 | 2.2 |
| Preparative Example 2 | 3.7 |
| Comparative Example 1 | 2.0 |
| Comparative Example 2 | 0.22 |

As shown in Table 1, the inventive compounds of Preparative Examples 1-2 had higher dipole moments than the compounds of Comparative Examples 1-2, demonstrating that coating of the conductive base with each inventive compound (SAM) can reduce the work function of the conductive base, enabling more efficient transport of holes generated in a perovskite absorber layer.

Experimental Example 2

Cyclic voltammetry was conducted to compare the electrochemical properties of the compounds of Preparative Examples 1-2 with those of the compounds of Comparative Examples 1-2. The results are shown in FIG. 15 and Table 2.

TABLE 2

|  | Oxidation potential (V) | Reduction potential (V) | Redox potential (V) |
| --- | --- | --- | --- |
| Preparative Example 1 | 0.45 | 0.37 | 0.41 |
| Preparative Example 2 | 0.58 | 0.51 | 0.54 |
| Comparative Example 1 | 0.60 | 0.53 | 0.56 |
| Comparative Example 2 | 0.47 | 0.39 | 0.43 |

As can be seen from the results in FIG. 15 and Table 2, the compounds of Preparative Examples 1-2 showed redox potentials similar to those of the compounds of Comparative Examples 1-2. Particularly, the redox potentials of the compounds of Preparative Examples 2 and 1 were similar to those of the compounds of Comparative Examples 1 and 2, respectively. Each of the materials acts as a hole transport material for efficient hole transport in a perovskite solar cell only when its redox potential is the same as or slightly higher than the energy level of the valence band of a perovskite absorber layer. These results concluded that the abilities of the compounds of Examples 1 and 2 to transport holes are similar to those of the compounds of Comparative Example 2 and Comparative Example 1, respectively.

Example 1

A patterned indium tin oxide (ITO) glass base (25×25 mm, 15 Ωsq$^{-1}$) was sequentially washed with distilled water, acetone, and ethanol in an ultrasonic cleaner for 15 min and dried in an oven under a nitrogen atmosphere at 70° C. for 1 h. Thereafter, the glass base was surface treated in a plasma cleaner for 10 min and put into a nitrogen-filled glove box. 1 mg/ml of a solution of the compound (SAM) of Preparative Example 1 was dissolved in ethanol by sonication for 20 min. 100 µl of the SAM solution was stacked on the center of the ITO base, spin-coated at 3000 rpm/30 sec, and baked on a hot plate at 100° C./10 min. PbI$_2$ and PbBr$_2$ were dissolved at a concentration of 1.5 M in a mixture of dimethylformamide (DMF) and dimethyl sulfoxide (DMSO) in a 4:1 volume ratio with stirring at 70° C. for 24 h to prepare PbI$_2$ and PbBr$_2$ stock solutions, respectively. Then, the 1.5 M stock solutions were added to formamidinium iodide (FAI) and methylammonium bromide (MABr) powders to prepare FAPbI$_3$ and MAPbBr$_3$ solutions (final concentration 1.24 M), respectively. Then, the FAPbI$_3$ and MAPbBr$_3$ solutions were mixed in a 5:1 volume ratio to prepare a FA$_{0.83}$MA$_{0.17}$Pb(I$_{0.83}$Br$_{0.17}$)$_3$ perovskite precursor solution composed of mixed cations. A 1.5 M cesium iodide stock solution (in DMSO) was added to the mixed cation solution in a 5:1 volume ratio to prepare a triple cation (Cs$_{0.05}$(FA$_{0.83}$MA$_{0.17}$)$_{0.95}$Pb(I$_{0.83}$Br$_{0.17}$)$_3$) perovskite precursor solution. 80 μl of the triple cation perovskite precursor solution was dropped onto the SAM-coated base as a conductive substrate and rotated at 4000 pm for 35 sec. 10 sec before the end of the rotation, 200 μl of chlorobenzene as an antisolvent was dropped onto the center of the substrate. After completion of the rotation, baking was performed on a hot plate at 100° C. for 30 min to form an absorber layer. Subsequently, the substrate was cooled, taken out of the glove box, placed in a vacuum deposition system, sequentially thermally deposited with C60 (thickness 30 nm) and BCP (thickness 8 mm) to form an electron transport layer, and thermally deposited with Ag to form an Ag electrode (thickness 90 nm) as a counter electrode, completing the fabrication of a perovskite solar cell.

Example 2

A perovskite solar cell was fabricated in the same manner as in Example 1, except that the compound of Preparative Example 2 was used to form a SAM.

Comparative Example 1

A perovskite solar cell was fabricated in the same manner as in Example 1, except that 2PACz was used to form a SAM.

Comparative Example 2

A perovskite solar cell was fabricated in the same manner as in Example 1, except that MeO-2PACz was used to form a SAM.

Test Example 2

The photoelectric conversion efficiencies of the perovskite solar cells fabricated in Examples 1-2 and Comparative Examples 1-2 were evaluated. To this end, the photovoltages and photocurrents of the solar cells were measured by the following procedure to observe the photoelectric properties of the solar cells. The photoelectric conversion efficiencies (ηe) of the solar cells were calculated according to Equation 1 using the obtained current densities (Isc), voltages (Voc), and fill factors (ff).

A xenon lamp (Oriel) was used as a light source. The solar condition (AM 1.5) of the xenon lamp was calibrated using a standard solar cell.

Photoelectric conversion efficiency (ηe)=(Voc×Iscx ff)/($P_{ine}$) where $P_{ine}$ represents 100 mW/cm² (1 sun).  <Equation 1>

TABLE 3

| Properties | Example 1 | | Example 2 | | Comparative Example 1 | | Comparative Example 2 | |
|---|---|---|---|---|---|---|---|---|
| | Forward | Reverse | Forward | Reverse | Forward | Reverse | Forward | Reverse |
| Current density (mA/cm²) | 21.20 | 21.17 | 21.23 | 21.28 | 20.88 | 20.95 | 21.77 | 21.81 |
| Voltage (V) | 1.03 | 1.02 | 1.11 | 1.12 | 1.08 | 1.09 | 1.07 | 1.05 |
| Fill factor (%) | 0.74 | 0.73 | 0.75 | 0.76 | 0.68 | 0.73 | 0.70 | 0.70 |
| Photoelectric conversion efficiency (%) | 16.02 | 15.78 | 17.85 | 18.11 | 15.27 | 16.72 | 16.21 | 16.11 |

As can be seen from the results in Table 3, the photoelectric conversion efficiencies of the perovskite solar cells including hole transport layers formed using the materials of Preparative Examples 1-2 were improved compared to those of the perovskite solar cells fabricated using the materials known in the art. In addition, the differences between the forward and reverse conversion efficiencies (hysteresis indices) of the perovskite solar cells fabricated in Examples 1-2 were significantly reduced compared to those of the perovskite solar cells fabricated in Comparative Examples 1-2. These results are believed to be because the materials of Preparative Examples 1-2 have similar redox potentials to but higher dipole moments than the materials of Comparative Examples 1-2, which further lowers the work function of the conductive base, enabling more efficient hole transport.

| <Explanation of reference numerals> |
|---|
| 100: Conductive base |
| 110: Conductive compound (SAM) |
| 120: Current carrying layer |
| 130: Perovskite layer |
| 140: Electron transport layer (ETL) |
| 150: Counter electrode |

INDUSTRIAL APPLICABILITY

The conductive substrate of the present invention uses a specific conductive compound that is capable of multi-electron redox reactions, possesses p-type organic molecular properties, and has an oxidation potential or highest occupied molecular orbital (HOMO) matching the valence band of perovskite so that holes generated in an absorber layer are selectively separated for the application of the perovskite material, achieving enhanced photoelectric conversion efficiency of the solar cell and a significantly reduced difference between the forward and reverse conversion efficiencies (hysteresis index) of the solar cell. Due to these advantages, the conductive substrate of the present invention can be used in technologies related to perovskite substrates and solar cells.

The invention claimed is:

1. A conductive substrate comprising a conductive base and a conductive compound stacked on the conductive base, the conductive compound being represented by Formula 3:

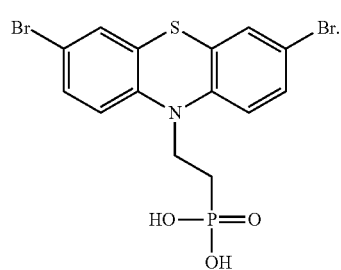

<Formula 3>

2. The conductive substrate according to claim 1, further comprising a current carrying layer deposited between the conductive base and the conductive compound.

3. The conductive substrate according to claim 1, wherein the conductive compound forms a self-assembled monolayer (SAM) on the conductive base.

4. The conductive substrate according to claim 1, wherein the conductive compound is a hole transport material.

5. The conductive substrate according to claim 1, wherein the conductive compound has a dipole moment of 0.1 to 6.

\* \* \* \* \*